US006958631B2

(12) United States Patent
Aiba et al.

(10) Patent No.: US 6,958,631 B2
(45) Date of Patent: Oct. 25, 2005

(54) HIGH-SPEED CURRENT SWITCH CIRCUIT

(75) Inventors: Yusuke Aiba, Atsugi (JP); Masaki Ikeda, Sagamihara (JP); Takeshi Fujita, Isehara (JP); Hideaki Hirose, Yokohama (JP); Akio Maruo, Ebina (JP)

(73) Assignee: Asahi Kasei Microsystems Co., Ltd., Tokyo (JP)

( * ) Notice: Subject to any disclaimer, the term of this patent is extended or adjusted under 35 U.S.C. 154(b) by 0 days.

(21) Appl. No.: 10/168,572

(22) PCT Filed: Dec. 21, 2001

(86) PCT No.: PCT/JP01/11292

§ 371 (c)(1),
(2), (4) Date: Jun. 21, 2002

(87) PCT Pub. No.: WO02/51009

PCT Pub. Date: Jun. 27, 2002

(65) Prior Publication Data

US 2002/0190779 A1 Dec. 19, 2002

(30) Foreign Application Priority Data

Dec. 21, 2000 (JP) ......................................... 2000-388148

(51) Int. Cl.[7] ........................ H03K 17/687; H03K 17/04
(52) U.S. Cl. ........................ 327/112; 327/374; 327/437
(58) Field of Search ................................ 327/108, 112, 327/374, 427, 434, 437; 326/83

(56) References Cited

U.S. PATENT DOCUMENTS

| 4,331,886 A | | 5/1982 | Perner et al. | |
|---|---|---|---|---|
| 5,166,630 A | | 11/1992 | Lee | |
| 5,220,587 A | | 6/1993 | Takemoto et al. | ............ 377/57 |
| 5,457,433 A | * | 10/1995 | Westwick | ............. 331/116 FE |
| 5,497,127 A | | 3/1996 | Sauer | ........................... 331/17 |
| 5,623,216 A | | 4/1997 | Penza et al. | ................... 326/27 |
| 5,673,058 A | * | 9/1997 | Uragami et al. | ............... 345/3 |
| 5,781,045 A | | 7/1998 | Walia et al. | ................. 327/108 |
| 6,100,725 A | * | 8/2000 | Aswell et al. | ............... 327/108 |
| 6,359,491 B1 | * | 3/2002 | Cairns et al. | ............... 327/333 |
| 6,653,886 B1 | * | 11/2003 | Lee et al. | ..................... 327/374 |

FOREIGN PATENT DOCUMENTS

| JP | 01-115181 A | 5/1989 | |
|---|---|---|---|
| JP | 5-300000 | 11/1993 | ....... H03K/19/0185 |
| JP | 6-85622 | 3/1994 | .......... H03K/3/354 |
| JP | 2000-252521 | 9/2000 | ........... H01L/33/00 |
| JP | 2000-278105 | 10/2000 | ............ H03K/7/06 |

OTHER PUBLICATIONS

Official Letter dated Nov. 8, 2004 of German Patent Office.

* cited by examiner

*Primary Examiner*—Terry D. Cunningham
*Assistant Examiner*—Terry L. Englund
(74) *Attorney, Agent, or Firm*—Finnegan, Henderson, Farabow, Garrett & Dunner, L.L.P.

(57) ABSTRACT

A high-speed current switch circuit of this invention has an n-type MOS transistor Q11 which switches and outputs a current, and a control circuit 11 which performs switching control of the MOS transistor Q11. In the control circuit 11, a source follower is formed by an N-type MOS transistor Q12 and a constant current source I2 which is a load on this transistor. A switch SW11 is connected to the MOS transistor Q12 to perform switching control of a current flowing through the MOS transistor Q12. The control circuit 11 includes a switch SW12 capable of grounding the gate of the MOS transistor 11. The source of the MOS transistor Q12 is connected to the gate of the MOS transistor Q11. Thus, even if a large current is caused to flow through the output transistor, the output transistor can be made to operate for switching at a high speed.

13 Claims, 15 Drawing Sheets

FIG. 15
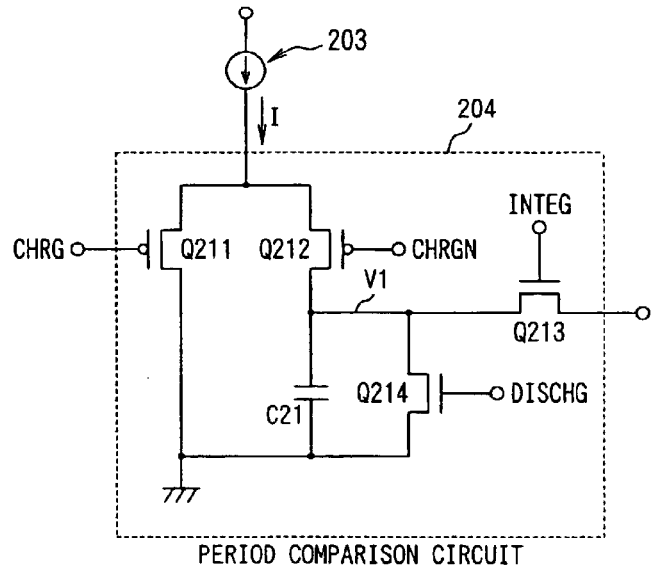
PERIOD COMPARISON CIRCUIT
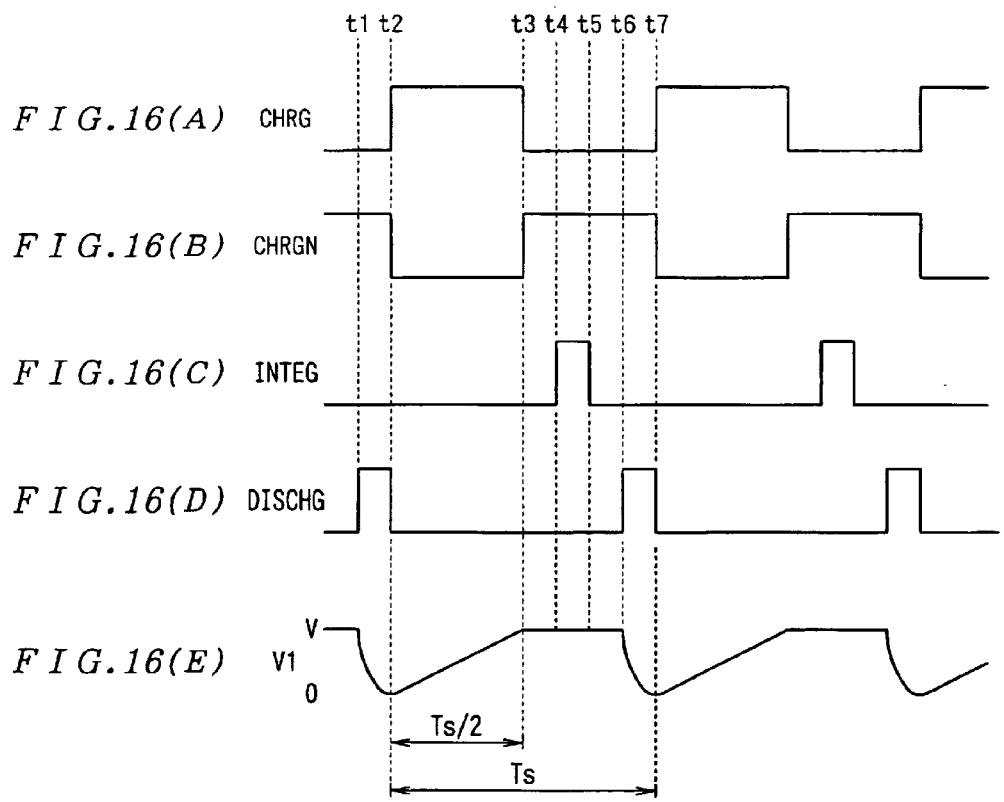
FIG.16(A) CHRG
FIG.16(B) CHRGN
FIG.16(C) INTEG
FIG.16(D) DISCHG
FIG.16(E) V1

HIGH-SPEED CURRENT SWITCH CIRCUIT

TECHNICAL FIELD

The present invention relates to a high-speed current switch circuit in which a transistor is switched to perform high-speed switching of a current flowing through the transistor, and relates to a high-frequency current source using the high-speed current switch circuit.

The present invention also relates to an oscillator designed so as to stabilize oscillation frequency.

The present invention further relates to a high-frequency superimposition circuit in which an output from an oscillator is used in switching control of a high-speed current switch circuit and a high-frequency current source using the high-speed current switch circuit to extract a high-frequency current.

Further, the present invention is suitable for a laser diode drive circuit for driving a laser diode in a device for read and write of data on a storage medium, e.g., a CD-R, a CD-RW, or a DVD-RAM.

BACKGROUND ART

In a device for read and write of data on a storage medium such as a CD-R, a CD-RW or a DVD-RAM, a laser diode and a laser diode drive circuit are used to irradiate the storage medium with light for read or write of data.

Ordinarily, a laser diode drive circuit is, as shown in FIG. 19, constituted by an oscillator 1, a high-speed current switch circuit (or high-frequency current source) 2, and a high-speed current switch circuit 3.

The high-speed current switch circuit (high-frequency current source) 2 is arranged to switch a current flowing through a laser diode 4 on the basis of an oscillating output from the oscillator 1. The high-speed current switch circuit 2 forms a high-frequency superimposition circuit. The high-speed current switch circuit 3 is arranged to switch a current flowing through a laser diode 4 on the basis of a signal externally supplied.

As this kind of laser diode drive circuit, a high-speed current switch circuit is demanded in which a large current for driving a laser diode is caused to rise at a high rate, and in which the overshoot of the current when the current rises is limited.

For example, a circuit shown in FIG. 20 is known as a conventional high-speed current switch circuit.

This conventional high-speed current switch circuit has an output MOS transistor Q1, a switch SW1 connected to the drain of the MOS transistor Q1, a MOS transistor Q2 which supplies a predetermined bias voltage to the MOS transistor Q1, and a constant current source I1 which supplies a constant current to the MOS transistor Q2.

As shown in FIG. 21, the switch SW1 is constituted by a switching MOS transistor Q3. A switching signal is applied to the gate of the MOS transistor Q3 through a buffer BF.

In the conventional circuit thus formed, a current flowing through the MOS transistor Q1 is switched by performing open/close control of the switch SW1.

Since in this conventional circuit the switch SW1 is inserted in the current path of the MOS transistor Q1 as shown in FIG. 20, a voltage drop occurs due to the on resistance of the switch SW1. To secure an output compliance range of the circuit, therefore, it is necessary to reduce the on resistance of the switch SW1.

To do so, the size of the MOS transistor Q3 used as switch SW1 as shown in FIG. 21, i.e., the ratio (W/L) of the channel width (W) and the channel length (L), must be increased, resulting in an increase in the gate capacitance Cg of the MOS transistor Q3.

Thus, this conventional circuit has the drawback of having difficulty in performing high-speed switching of the switch SW1. It also has a drawback in that when an output current rises, charge injection through the switch SW1 can easily cause a considerably large overshoot.

Another conventional high-speed current switch circuit shown in FIG. 22 is known.

This another conventional high-speed current switch circuit has an output MOS transistor Q1, a MOS transistor Q2 which supplies a predetermined bias voltage to the MOS transistor Q1, and a constant current source I1 which supplies a constant current to the MOS transistor Q2. The gate of the MOS transistor Q1 and the gate of the MOS transistor Q2 are connected to each other through a switch SW2, and the gate of the MOS transistor Q1 is grounded through a switch SW3.

In this another conventional circuit thus arranged, a voltage applied to the gate of the MOS transistor Q1 is controlled by alternately closing the switch SW2 and the switch SW3 to switch a current Iout drawn by the MOS transistor Q1.

That is, the gate voltage on the MOS transistor Q1 is set to a bias supply voltage Vb supplied from the MOS transistor Q2 by setting the switches SW2 and SW3 in the closed state and in the open state, respectively, to turn on the MOS transistor Q1. Alternatively, the gate voltage on the MOS transistor Q1 is set to ground potential Vss by changing the states of the switches SW2 and SW3 so that the switches SW2 and SW3 are set in the open state and in the closed state, respectively, to turn off the MOS transistor Q1.

In this another conventional circuit, a rise time τ during which the gate voltage on the MOS transistor Q1 rises from the ground potential Vss to the bias supply voltage Vb is determined by the following equation (1):

$$\tau = R \times Cg \qquad (1)$$

where R is the sum of the on resistance Ron of the switch SW2 and the value of 1/Gm of the transistor Q2, and Cg is the gate capacitance of the MOS transistor Q1.

This shows that reducing the on resistance Ron of the switch SW2 or reducing the value of 1/Gm of the transistor Q2 are necessary for enabling high-speed current switching.

To reduce the on resistance of the switch SW2, the size of the MOS transistor Q3 used as switch SW2 as shown in FIG. 21, i.e., the ratio (W/L) of the channel width (W) and the channel length (L), must be increased, resulting in an increase in the gate capacitance Cg of the MOS transistor Q3.

Thus, another conventional circuit also has the drawback of having difficulty in performing high-speed switching of the switch SW2. It also has a drawback in that when an output current rises, a considerably large overshoot can occur easily because charge injection through the switch SW2 occurs on the gate of the transistor Q1.

To reduce 1/Gm of the MOS transistor Q2, it is necessary to increase the current I1 flowing through the MOS transistor Q2 or the size of the MOS transistor Q2, i.e., the value of W/L. Increasing the current I1, however, entails a drawback in that the consumption current in the circuit is increased.

Increasing the size of the MOS transistor Q2, i.e., the value of W/L, involves increasing the size of the MOS transistor Q1 if the output current is constantly maintained, because the MOS transistor Q1 and the MOS transistor Q2 are in the current-mirror relationship. An increase in the gate capacitance of the MOS transistor Q1 also results. Thus, there is a drawback in that the circuit area is increased while the effect of increasing the switching speed is not sufficiently high.

If there is a need to cause a large current to flow through the MOS transistor Q1, the transistor size (W/L) of the MOS transistor Q1 must be increased, resulting in an increase in the gate capacitance Cg of the MOS transistor Q1. An increase in rise time τ results. Thus, this another conventional circuit also has the drawback of having difficulty in performing high-speed switching of the MOS transistor Q1.

In the oscillator used in this kind of laser diode drive circuit, the frequency of unwanted emission noise from the circuit is determined by the oscillation frequency of the oscillator since the oscillation output from the oscillator is used for control of the high-speed current switch circuit. Therefore, an oscillator in which variation in oscillation frequency is limited and in which the oscillation frequency is not easily changed by a change in temperature or power supply voltage during operation is required by considering the facility with which means is adopted to cope with unwanted emission noise.

For example, a ring oscillator such as shown in FIG. 23 is known as a conventional oscillator corresponding to that shown in FIG. 19.

In this ring oscillator, inverters (inverting devices) 4, e.g., CMOS inverters are connected in series in an odd number of stages as shown in FIG. 23 and an output from the final stage is fed back to the input to the initial stage to perform self-excited oscillation.

The oscillation frequency f of such a ring oscillator is expressed by the following equation (2):

$$f = 1/2n\tau \qquad (2)$$

where n is the number of stages in which inverters 4 are connected and τ is a delay time per inverter 4 stage.

The oscillator arranged as described above has a drawback in that the operating speed of the inverter 4 changes due to a change in operating temperature, a change in power supply voltage, a difference between manufacturing process conditions, or the like, and the oscillation frequency can easily vary largely.

An oscillator shown FIG. 24 is known as one designed so as to be improved in terms of variation in oscillation frequency. That is, this oscillator is designed to reduce variation in oscillation frequency by providing a current limiter for each of inverters 5, the limiter limiting a current i supplied to inverters 5. The current value i of the current limiter may be made variable to enable the oscillation frequency to be changed.

This oscillator, however, also has a drawback in that the oscillation frequency varies due to changes in power supply voltage or variation in the capacitance value of capacitive elements Cm. There is also a problem that the oscillation frequency varies, as is that in the oscillator shown in FIG. 23, if the value of the limit current of the current limiter is large.

In view of the above-described problems, a first object of the present invention is to provide a high-speed current switch circuit capable of operating at a high speed.

A second object of the present invention is to provide a high-frequency current source arranged to produce a high-frequency current by being combined with the above-mentioned high-speed current switch circuit.

A third object of the present invention is to provide a high-speed current switch circuit capable of operating at a high speed without increasing consumption current.

A fourth object of the present invention is to provide a high-speed current switch circuit in which the overshoot when an output current rises is reduced, and which is capable of operating at a high speed.

A fifth object of the present invention is to provide an oscillator designed so as to stabilize the oscillation frequency as well as to improve the oscillation accuracy.

A sixth object of the present invention is to provide a high-frequency superimposition circuit which operates at a high speed with stability.

DISCLOSURE OF THE INVENTION

A high-speed current switch circuit of the present invention has an output transistor which switches and outputs a current, and a control circuit which is formed of a source follower, and which performs switching control of the output transistor, an output terminal of the source follower being connected to an input terminal of the output transistor, the source follower being connected to a power supply through a first switch.

In the high-speed current switch circuit of the present invention, a second switch with which the input terminal of the output transistor is set in a grounded state or in a predetermined potential state is provided at the input terminal.

The high-speed current switch circuit of the present invention further has a bias voltage generation circuit which generates a predetermined bias voltage to be supplied to an input terminal of the source follower.

In the high-speed current switch circuit of the present invention, a predetermined transistor included in the bias voltage generation circuit and the output transistor have a current mirror relationship.

In the high-speed current switch circuit of the present invention, the bias voltage generation circuit includes stabilization means which stabilizes a generated bias voltage.

In the high-speed current switch circuit of the present invention, as described above, control of the voltage input to the output transistor is directly performed by using the source follower without intermediation of a switch. Therefore the output transistor can be made to operate for switching at a high speed while limiting an overshoot even in a case where a large current is caused to flow through the output transistor.

Also, in the high-speed current switch circuit of the present invention, the bias voltage generation circuit is provided and a predetermined transistor included in the bias voltage generation circuit and the output transistor have a current mirror relationship. In this case, therefore, the current flowing through the output transistor can be set as desired through the size ratio of the two transistors.

Further, in the high-speed current switch circuit of the present invention, the bias voltage generation circuit includes stabilization means for stabilizing a generated bias voltage. In this case, therefore, variation in the bias voltage from the source follower when the source follower performs an on/off operation can be reduced.

A high-frequency current source of the present invention has a current drawing type (sink current type) of high-speed current switch circuit and a current supply type (source current type) of high-speed current switch circuit, and generates a high-frequency current according to a control signal externally supplied. The current drawing type of high-speed current switch circuit has a first output transistor which switches and outputs a current, and a first control circuit which is formed of a first source follower, and which performs switching control of the first output transistor, an output terminal of the first source follower being connected to an input terminal of the first output transistor, the first source follower supplying a power supply voltage through a first switch. The current supply type of high-speed current switch circuit has a second output transistor which switches and outputs a current, and a second control circuit which is formed of a second source follower, and which performs switching control of the second output transistor, an output terminal of the second source follower being connected to an input terminal of the second output transistor, the second source follower being grounded through a second switch.

In the high-frequency current source of the present invention, as described above, the current supply type of high-speed current switch circuit and the current drawing type of high-speed current switch circuit which operate for switching at a high speed are combined, thereby enabling generation of a high-frequency current having no direct current component.

Another high-speed current switch circuit of the present invention has a current setting circuit in which a current is externally set, a selection circuit which selects a current path for a set current set by the current setting circuit from a first current path and a second current path according to an input signal, a current mirror circuit which provides an output current at a predetermined current ratio to the set current flowing through the first current path, and which includes a feedback circuit, and an output current optimization circuit which optimizes the rise of the output current of the current mirror circuit by adjusting a phase margin of the feedback circuit.

Another high-speed current switch circuit of the present invention has a current setting circuit in which a current is externally set, a selection circuit which selects a current path for a set current set by the current setting circuit from a first current path and a second current path according to an input signal, and which includes first and second transistors, a current mirror circuit including a third transistor connected in series with the first transistor, a first source follower which drives the third transistor, a fourth transistor which forms a current mirror relationship with the third transistor, and which provides a desired output current, and a second source follower which drives the fourth transistor under the same condition as the first follower, a feedback circuit being formed between the third transistor and the first source follower, the first and second source followers being driven according to an output from the third transistor, and an output current optimization circuit which optimizes the rise of the output current of the current mirror circuit by adjusting a phase margin of the feedback circuit.

In another high-speed current switch circuit of the present invention, the output current optimization circuit has a variable resistance element connected between an output side of the first source follower and an output side of the second source follower, and capable of being changed between a low resistance and a high resistance, comparison means which compares an output current from the fourth transistor with a predetermined value when the output current rises, and which changes the variable resistance element from the low resistance to the high resistance when the output current exceeds the predetermined value, and initialization means which changes the variable resistance element from the high resistance to the low resistance when the output current from the fourth transistor falls.

In another high-speed current switch circuit of the present invention, the variable resistance element is formed of a MOS transistor.

In another high-speed current switch circuit of the present invention, the output current optimization circuit has a resistance element having a predetermined resistance value and connected between the output side of the first source follower and the output side of the second source follower.

In another high-speed current switch circuit of the present invention, the resistance element is made of polysilicon.

As described above, another high-speed current switch circuit of the present invention is provided with the current mirror circuit having a feedback circuit and the output current optimization circuit which optimizes the rise of the output current of the current mirror circuit by adjusting the phase margin of the feedback circuit.

In another high-speed current switch circuit of the present invention, therefore, the output current rise time can be shortened and an overshoot of the output current can be suppressed.

An oscillator of the present invention has oscillation means in which the oscillation frequency is controlled on the basis of a current or voltage externally supplied, a constant current source circuit, charge means which charges a capacitor with a constant current from the constant current source circuit on the basis of an oscillation output from the oscillation means, and control means which generates the current or voltage for control of the oscillation frequency of the oscillation means on the basis of electric charge stored in the capacitor and a predetermined reference value.

In the oscillator of the present invention, the constant current source circuit generates the constant current on the basis of a bandgap voltage.

In the oscillator of the present invention, the control means includes an integrator formed of an operational amplifier and an integrating capacitor, the integrator performs integration on the basis of the charged voltage across the capacitor and the predetermined reference value, and the current or voltage for control of the oscillation frequency of the oscillation means is generated on the basis of an integrated output from the integrator.

In the oscillator of the present invention, the oscillation means is a current-controlled oscillator, the control means includes a voltage-current conversion circuit which converts the output from the integrator into a current, and an output current from the voltage-current conversion circuit is supplied to the current-controlled oscillator.

In the oscillator of the present invention, the constant current source circuit is arranged so that the constant current generated therein is variable according to the value of a resistance, and the oscillation frequency of the oscillation means is changed on the basis of change of the value of the resistance.

In the oscillator of the present invention, a frequency divider which divides the frequency of the oscillation output from the oscillation means is interposed between the oscillation means and the control means.

In the oscillator of the present invention, the frequency divider is arranged so that its division ratio is variable, and the oscillation frequency is changed on the basis of the division ratio.

In the thus-arranged oscillator of the present invention, the oscillation frequency can be determined on the basis of the value of the constant current for charging the capacitor and the predetermined reference value (reference voltage)

required when the current or voltage for controlling the oscillation frequency is generated. It is possible to obtain these values while minimizing the degree to which they are influenced by variation in power supply voltage or operating temperature.

In the oscillator of the present invention, therefore, the degree of influence of variation in power supply voltage or operating temperature on the oscillation frequency can be minimized to stabilize the oscillation frequency as well as to improve the oscillation accuracy.

A high-frequency superimposition circuit of the present invention has an oscillator and a high-speed current switch circuit which performs high-speed switching of an output current on the basis of an oscillation output from the oscillator. The high-speed current switch circuit has an output transistor which switches and outputs a current, and a control circuit which is formed of a source follower, and which performs switching control of the output transistor. An output terminal of the source follower is connected to an input terminal of the output transistor, and the source follower is connected to a power supply through a switch.

In the high-frequency superimposition circuit of the present invention, the oscillator has oscillation means in which the oscillation frequency is controlled on the basis of a current or voltage externally supplied, a constant current source circuit, charge means which charges a capacitor with a constant current from the constant current source circuit on the basis of an oscillation output from the oscillation means, and control means which generates the current or voltage for control of the oscillation frequency of the oscillation means on the basis of electric charge stored in the capacitor and a predetermined reference value.

The thus-arranged high-frequency superimposition circuit of the present invention enables a laser diode to operate at a high speed with stability.

Another high-frequency superimposition circuit of the present invention has an oscillator and a high-speed current switch circuit which performs high-speed switching of an output current on the basis of an oscillation output from the oscillator. The high-speed current switch circuit has a current setting circuit in which a current is externally set, a selection circuit which selects a current path for a set current set by the current setting circuit from a first current path and a second current path according to an input signal, a current mirror circuit which provides an output current at a predetermined current ratio to the set current flowing through the first current path, and which includes a feedback circuit, and an output current optimization circuit which optimizes the rise of the output current of the current mirror circuit by adjusting a phase margin of the feedback circuit.

The thus-arranged high-frequency superimposition circuit of the present invention enables faster start-up of the operation of the laser diode and can drive the laser diode with stability.

BRIEF DESCRIPTION OF THE DRAWINGS

FIG. 15 is a circuit diagram showing a more concrete configuration of a period comparison circuit in FIG. 14;

FIG. 16 is a waveform diagram of sections of a period comparison circuit for explaining an operation of the period comparison circuit;

BEST MODE FOR CARRYING OUT THE INVENTION

Embodiments of the present invention will be described with reference to the accompanying drawings.

A configuration of a first embodiment of a high-speed current switch circuit of the present invention will be described with reference to FIG. 1.

Figure 1:
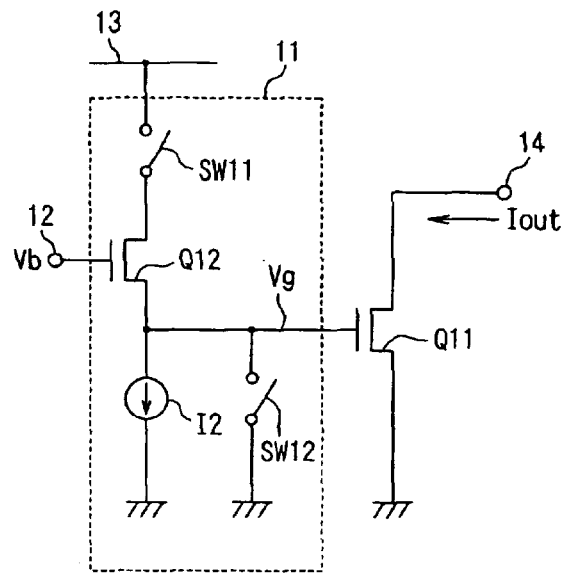
FIG. 1 is a circuit diagram showing a configuration of a first embodiment of a high-speed current switch circuit of the present invention.

As shown in FIG. 1, the first embodiment of the high-speed current switch circuit has an n-type MOS transistor Q11 which switches and outputs a current, and a control circuit 11 which performs switching control of the MOS transistor Q11.

In the control circuit 11, a source follower is formed by an n-type MOS transistor Q12 and a constant current source I2 which is a load on the transistor Q12. A switch SW11 formed, e.g., of a MOS transistor is connected to the MOS transistor Q12 to perform switching control of a current flowing through the MOS transistor Q12. The control circuit 11 includes a switch SW12 capable of grounding the gate of MOS transistor 11.

In more detail, a gate of the MOS transistor 12 is connected to a bias terminal 12, and a bias voltage Vb supplied to the bias terminal 12 is applied to the gate. Also, a drain of the MOS transistor Q12 is connected to a power supply line 13 through the switch SW11, and a source of the MOS transistor Q12 is grounded through the constant current source I2.

The source of MOS transistor Q12 is connected to the gate of the MOS transistor Q11, and this gate can be grounded through the switch SW12. The drain of the MOS transistor Q11 is connected to an output terminal 14, and the source of the MOS transistor Q11 is grounded.

The constant current source I2, used for level shifting, may be replaced with a resistor or a MOS transistor.

The operation of the first embodiment thus formed will next be described with reference to FIG. 1.

In the first embodiment, the bias voltage Vb is applied to the gate of the MOS transistor Q12 during operation.

In a state where the switch SW11 is open while the switch SW12 is closed, the gate of the MOS transistor Q11 is grounded by the switch SW12, the potential at the gate is 0 V, the MOS transistor Q11 is in the off state, and, therefore, no output current Iout flows through the MOS transistor Q11.

On the other hand, in a state where the switch SW11 is closed while the switch SW12 is open, the source voltage of the MOS transistor Q12 is applied to the gate of the MOS transistor Q11 and charge is thereby supplied to the gate to increase the gate voltage Vg. The MOS transistor Q11 is thereby turned on and output current Iout flows through the MOS transistor Q11.

Thus, the gate voltage Vg on the MOS transistor Q11 is controlled by alternately closing the switches SW11 and SW12 of the control circuit 11 to perform the switching operation. Output current Iout is thereby caused to flow through the MOS transistor Q11 as an intermittent current.

If the transfer conductance of the MOS transistor Q12 is gm; the substrate effect transfer conductance is gds; and gm>>gds, output impedance Zo of the MOS transistor Q12 is as expressed by an equation (3):

$$Zo \approx 1/gm \quad (3)$$

Thereby, if the gate capacitance of the MOS transistor Q11 is Cg, the time τ during which the gate voltage Vg of the MOS transistor Q11 rises from 0 V to a predetermined potential is as expressed by the following equation (4):

$$\tau = Zo \times Cg = Cg/gm \quad (4)$$

Figure 22:
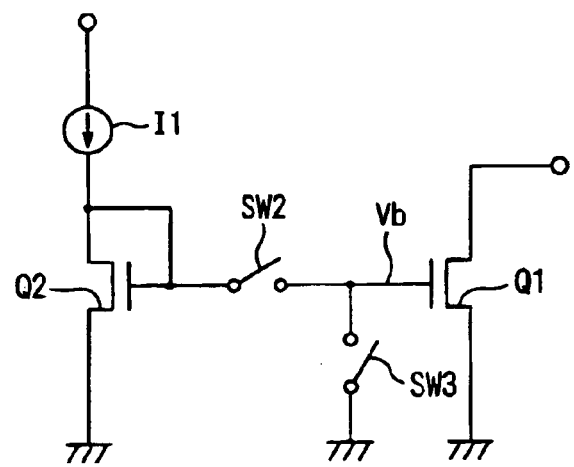
FIG. 22 is a circuit diagram of another conventional high-speed current switch circuit.
Figure 23:
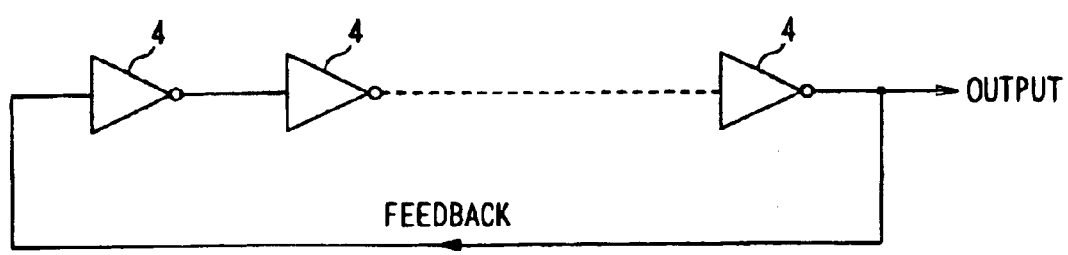
FIG. 23 is a block diagram showing a configuration of a conventional oscillator.
Figure 24:
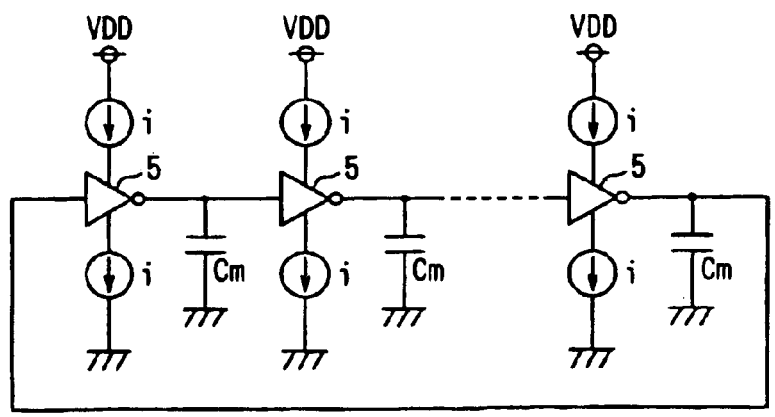
FIG. 24 is a block diagram showing a configuration of another conventional oscillator.

The transfer conductance gm of the MOS transistor Q12 can be easily increased. In comparison between the equation (4) and the equation (1), while it is difficult to reduce each of the on resistance Ron of the switch SW2 and the value of 1/Gm of the MOS transistor Q2 illustrated in FIG. 22, 1/gm of the MOS transistor Q12 can be easily reduced. If the circuit is formed so that 1/gm<<R, the gate voltage Vg rise time τ of the MOS transistor can be much shorter than that in the conventional circuit. Thus, the MOS transistor Q11 can operate to perform high-speed switching, for example, at 400 MHz.

According to the first embodiment, as described above, control of the gate voltage on the MOS transistor Q11, which is an output transistor, is performed by using a source follower, thereby enabling the MOS transistor Q11 to perform the switching operation at a high speed even in a case where a large current is caused to flow through the MOS transistor Q11.

A second embodiment of the high-speed current switch circuit of the present invention will next be described with reference to FIG. 2.

The second embodiment of the high-speed current switch circuit is arranged so that a method of applying the bias voltage Vb to the gate of the MOS transistor Q12 in the first embodiment shown in FIG. 1 is given in a concrete form, and so that the current Iout drawn by the MOS transistor Q11 can be set as desired through the size ratio of the transistor, as described below.

Figure 2:
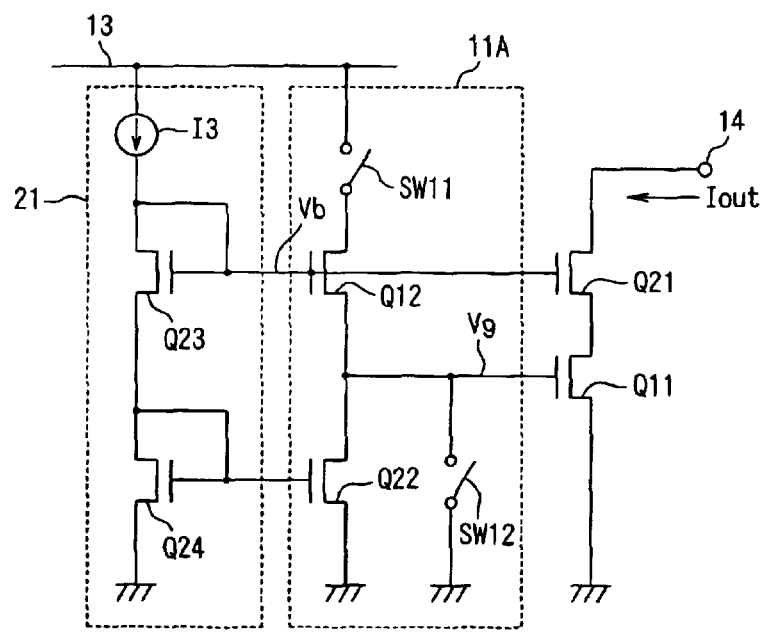
FIG. 2 is a circuit diagram showing a configuration of a second embodiment of the high-speed current switch circuit of the present invention.

In the second embodiment, therefore, the control circuit 11 shown in FIG. 1 is replaced with a control circuit 11A shown in FIG. 2 and a bias voltage generation circuit 21 and an n-type MOS transistor Q21 is added as shown in FIG. 2. The configuration of the second embodiment will be described.

As shown in FIG. 2, the configuration of the control circuit 11A is basically the same as that of the control circuit 11 shown in FIG. 1, but the control circuit 11A differs from the control circuit 11 in that the constant current source I2 shown in FIG. 1 is replaced with a MOS transistor Q22.

The MOS transistor Q21 is inserted between the drain of the MOS transistor Q11 and the output terminal 14 to be connected in series to the drain of the MOS transistor Q11.

As shown in FIG. 2, the bias voltage generation circuit 21 is formed, e.g., of a constant current source I3, an n-type MOS transistor Q23, and an n-type MOS transistor Q24, and these components are connected in series between a power supply line 13 and the ground.

The MOS transistor Q23, the MOS transistor Q12 and the MOS transistor Q21 form a current mirror. That is, the MOS transistor Q23 has its gate and drain connected to a common connection point which is connected to each of the gates of the MOS transistor Q12 and the MOS transistor Q21.

Also, the MOS transistor Q24 and the MOS transistor Q22 form a current mirror. That is, the MOS transistor Q24 has its gate and drain connected to a common connection point which is connected to the gate of the MOS transistor Q22.

In other respects, the configuration of the second embodiment is the same as that of the first embodiment shown in FIG. 1. Therefore, the same components are denoted by the same reference characters, and the description for them will not be repeated.

The operation of the second embodiment thus arranged will next be described with reference to FIG. 2.

In the second embodiment, the bias voltage Vb from the bias voltage generation circuit 21 is applied to the gate of the MOS transistor Q12 during operation.

In a state where the switch SW11 is open while the switch SW12 is closed, the gate of the MOS transistor Q11 is grounded by the switch SW12, the MOS transistor Q11 is in the off state, and, therefore, no drawn current (sink current) Iout flows through the MOS transistor Q11.

On the other hand, in a state where the switch SW11 is closed while the switch SW12 is open, the source voltage of the MOS transistor Q12 is applied to the gate of the MOS transistor Q11 to increase the gate voltage Vg. The MOS transistor Q11 is thereby turned on and drawn current Iout flows through the MOS transistor Q11.

As mentioned above, the MOS transistor Q24 and the MOS transistor Q22 form a current mirror, and the MOS transistor Q23 and the MOS transistor Q12 also form a current mirror.

Therefore, the same potential is applied to the gates of the MOS transistors Q24 and Q22, so that the current according to the ratio of the transistor sizes of these two transistors flows through the MOS transistor Q22.

If the size ratio of the MOS transistors Q23 and Q12 is the same as the size ratio of the MOS transistors Q24 and Q22, the gate-source voltages Vgs of the MOS transistors Q23 and Q12 are equal to each other. Since the gate voltages on the MOS transistors Q23 and Q12 are equal to each other, the MOS transistors Q23 and Q12 have source voltages equal to each other. Accordingly the gate voltages on the MOS transistors Q24 and Q11 are equal to each other. Since the two transistors are in the current mirror relationship, the current Iout flowing through the MOS transistor Q11 is as expressed by the following equation (5):

$$Iout = I \times (K1/K2) \tag{5}$$

where I is the current flowing through the MOS transistor Q24, K1 is the transistor size of the MOS transistor Q11, and K2 is the transistor size of the MOS transistor Q24.

In the second embodiment, as described above, control of the gate voltage on the MOS transistor Q11 is performed by using a source follower, thereby achieving the same effect as that of the first embodiment.

Also, in the second embodiment, the bias voltage generation circuit 21 is provided and the arrangement is such that the MOS transistor Q24 and the MOS transistor Q11 forming the bias voltage generation circuit 21 have a current mirror relationship. Therefore it is possible to set the current flowing through the MOS transistor Q11 as desired through the size ratio of the MOS transistors Q11 and Q24.

Further, in the second embodiment, the drain voltage of the MOS transistor Q11 is fixed by the MOS transistor Q21, so that the dependence of the output current Iout on the output terminal voltage can be reduced even in a situation where the potential at the output terminal 14 fluctuates.

A third embodiment of the high-speed current switch circuit of the present invention will next be described with reference to FIG. 3.

The third embodiment of the high-speed current switch circuit is arranged so that a method of applying the bias voltage Vb to the gate of the MOS transistor Q12 in the first embodiment shown in FIG. 1 is given in a concrete form, and so that the current Iout drawn by the MOS transistor Q11 can be set as desired through the size ratio of the transistor, as described below.

Figure 3:
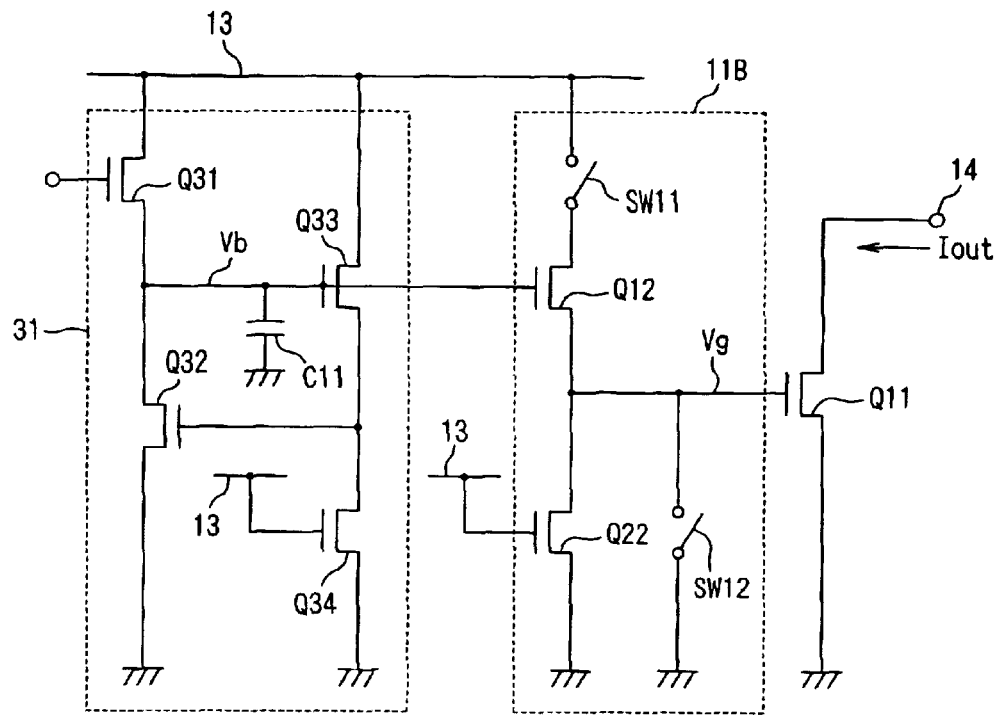
FIG. 3 is a circuit diagram showing a configuration of a third embodiment of the high-speed current switch circuit of the present invention.

In the third embodiment, therefore, the control circuit 11 shown in FIG. 1 is replaced with a control circuit 11B shown in FIG. 3 and a bias voltage generation circuit 31 is added as shown in FIG. 3. The configuration of the third embodiment will be described.

As shown in FIG. 3, the configuration of the control circuit 11B is basically the same as that of the control circuit 11 shown in FIG. 1, but the constant current source I2 shown in FIG. 1 is replaced with a MOS transistor Q22 and the gate of the same is connected to a power supply line 13.

As shown in FIG. 3, the bias voltage generation circuit 31 is constituted by n-type MOS transistors Q31 to Q34, etc. The MOS transistor 31 and the MOS transistor Q32 are connected in series between the power supply line 13 and the ground, and the MOS transistor Q23 and the MOS transistor Q34 are connected in series between the power supply line 13 and the ground.

The MOS transistor Q31 functions as a constant current source, which is supplied with a predetermined bias voltage applied to its gate.

The voltage at a common connection point between the MOS transistor Q31 and the MOS transistor Q32 is taken out as bias voltage Vb to be applied to the gates of the MOS transistors Q33 and Q12. Thus the MOS transistors Q33 and Q12 are in a current mirror relationship.

Further, the MOS transistor Q33 has a feedback circuit formed by the MOS transistor Q32 to stabilize the bias voltage Vb. A capacitor C11 for prevention of oscillation is connected between the gate of the MOS transistor Q33 and the ground.

Also, the gate of the MOS transistor Q34 is connected to the power supply line 13, as is that of the MOS transistor Q22, and the same voltage is applied to the gate. Thus the MOS transistors Q34 and Q22 is in a current mirror relationship.

In other respects, the configuration of the third embodiment is the same as that of the first embodiment shown in FIG. 1. Therefore the same components are indicated by the same reference characters, and the description for them will not be repeated.

The operation of the third embodiment thus arranged will next be described with reference to FIG. 3.

In the third embodiment, the bias voltage Vb from the bias voltage generation circuit 31 is applied to the gate of the MOS transistor Q12 during operation.

In a state where the switch SW11 is open while the switch SW12 is closed, the gate of the MOS transistor Q11 is grounded by the switch SW12, the MOS transistor Q11 is in the off state, and, therefore, no drawn current Iout flows through the MOS transistor Q11.

On the other hand, in a state where the switch SW11 is closed while the switch SW12 is open, the source voltage of the MOS transistor Q12 is applied to the gate of the MOS transistor Q11 to increase the gate voltage Vg. The MOS transistor Q11 is thereby turned on and drawn current Iout flows through the MOS transistor Q11.

As mentioned above, the MOS transistor Q34 and the MOS transistor Q22 form a current mirror, and the MOS transistor Q33 and the MOS transistor Q12 also form a current mirror.

Therefore, the same potential is applied to the gates of the MOS transistors Q34 and Q22, so that the current according to the ratio of the transistor sizes of these two transistors flows through the MOS transistor Q22.

If the size ratio of the MOS transistors Q33 and Q12 is the same as the size ratio of the MOS transistors Q34 and Q22, the gate-source voltages Vgs of the MOS transistors Q33 and Q12 are equal to each other. Since the gate voltages on the MOS transistors Q33 and Q12 are equal to each other, the MOS transistors Q33 and Q12 have source voltages equal to each other. Accordingly the gate voltages on the MOS transistors Q32 and Q11 are equal to each other. Since the two transistors are in the current mirror relationship, the current Iout flowing through the MOS transistor Q11 is as expressed by the following equation (6):

$$Iout = I \times (K1/K3) \tag{6}$$

where I is the current flowing through the MOS transistor Q32, K1 is the transistor size of the MOS transistor Q11, and K3 is the transistor size of the MOS transistor Q32.

In the third embodiment, as shown in FIG. 3, the MOS transistor Q33 has a feedback circuit formed by the MOS transistor Q32 to stabilize the generated bias voltage Vb. A description will be made of this.

If the output impedance of the MOS transistors Q31 and Q32 is Zo and the conductance of the MOS transistor Q32 is gm, the gain G of the open loop formed by the MOS transistor Q32 and other components is given by the following equation (7):

$$G = -(gm/Zo) \quad (7)$$

Even when the output from this open loop (the source voltage of the MOS transistor Q33) is changed, it is fed back to the gate of the MOS transistor Q33 while the change therein is multiplied by Zo/gm by the feedback circuit. Since Zo/gm<<1 and since the amount of feedback is extremely small, the change in bias voltage Vb is extremely small.

Thus, the change in bias voltage Vb applied to the gate of the MOS transistor Q12 when the MOS transistor Q12 is turned on or off is reduced by the feedback circuit.

In the third embodiment, as described above, control of the gate voltage on the MOS transistor Q11 is performed by using a source follower, thereby achieving the same effect as that of the first embodiment.

Also, in the third embodiment, the bias voltage generation circuit 31 is provided and the arrangement is such that the MOS transistor Q32 and the MOS transistor Q11 forming the bias voltage generation circuit 31 have a current mirror relationship. Therefore, it is possible to set the current flowing through the MOS transistor Q11 as desired through the size ratio of the MOS transistors Q11 and Q32.

A fourth embodiment of the high-speed current switch circuit of the present invention will next be described with reference to FIG. 4.

While in each of the first to third embodiments the MOS transistor Q11 is a current-drawing-type (sink current type) n-type transistor, a current-supply type (source current type) is provided as a corresponding transistor in the fourth embodiment.

In the fourth embodiment, therefore, the n-type MOS transistor Q11 shown in FIG. 1 is replaced with a p-type MOS transistor Q41 and the control circuit 11 shown in FIG. 1 is replaced with a control circuit 11C.

That is, in the control circuit 11C, a source follower is formed by a p-type MOS transistor Q42 and a constant current source I2 which is a load on the p-type MOS transistor Q42. A switch SW11 formed, e.g., of a MOS transistor is connected to the MOS transistor Q42 to perform switching control of a current flowing through the MOS transistor Q42. The control circuit 11C includes a switch SW12 for connecting the gate of MOS transistor Q41 to a power supply line 13.

In more detail, the gate of the MOS transistor Q42 is connected to a bias terminal 12, and a bias voltage Vb supplied to the bias terminal 12 is applied to the gate. Also, the drain of the MOS transistor Q42 can be grounded through the switch SW11, and the source of the MOS transistor Q42 is connected to the power supply line 13 through the constant current source I2.

The source of MOS transistor Q42 is connected to the gate of the MOS transistor Q41, and this gate can be connected to the power supply line 13 through the switch SW12. The drain of the MOS transistor Q41 is connected to an output terminal 14, and the source of the MOS transistor Q41 is connected to the power supply line 13.

The constant current source I2, used for level shifting, may be replaced with a resistor or a MOS transistor.

In the fourth embodiment thus arranged, the gate voltage Vg on the MOS transistor Q41 is controlled by alternately closing the switches SW11 and SW12 of the control circuit 11C to perform the switching operation. Output current Iout is thereby caused to flow through the MOS transistor Q41 as an intermittent current.

In the fourth embodiment, however, the MOS transistor Q41 functions as a current supply type, while in the first embodiment the MOS transistor Q11 functions as a current drawing type. In this respect, the two embodiments differ from each other.

According to the fourth embodiment, as described above, control of the gate voltage on the MOS transistor Q41 which is an output transistor is performed by using a source follower, thereby enabling the MOS transistor Q41 to perform the switching operation at a high speed even in a case where a large current is caused to flow through the MOS transistor Q41.

The fourth embodiment corresponds to the first embodiment shown in FIG. 1. However, the first embodiment in the mode of the fourth embodiment may be arranged in a concrete form corresponding to the second embodiment or the third embodiment, as it is arranged in a concrete form corresponding to the second or third embodiment.

The configuration of an embodiment of a high-frequency current source of the present invention will next be described with reference to FIG. 5.

Figure 7:
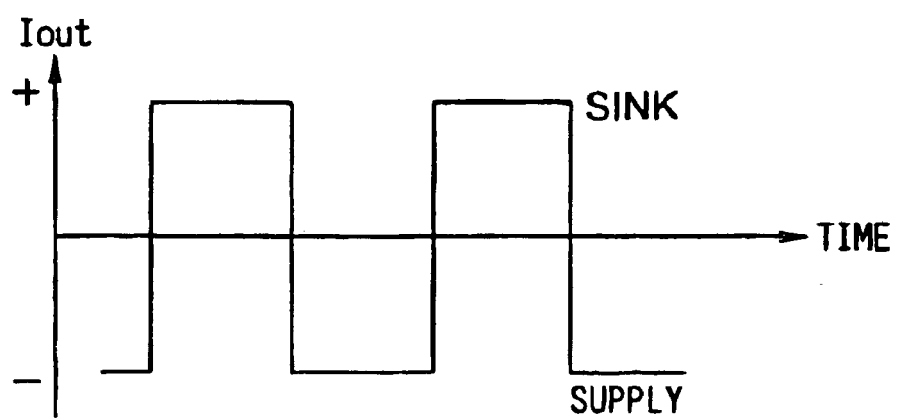
FIG. 7 is a waveform diagram showing an example of an output waveform in the embodiment of the high-frequency current source of the present invention.

This embodiment of the high-frequency current source is formed by combining a current supply type (source current type) of high-speed current switch circuit 51 and a current drawing type (sink current type) of high-speed current switch circuit 52 so as to produce a high-frequency current Iout such as shown in FIG. 7, for example.

In this embodiment, therefore, an external control signal (switch signal) is supplied to the high-speed current switch circuit 51 through an inverter 53 and the same control signal is supplied directly to the high-speed current switch circuit 52. On the basis of the control signal, the high-speed current switch circuit 52 stops drawing the current when the high-speed current switch circuit 51 supplies the current, and the high-speed current switch circuit 51 stops supplying the current when the high-speed current switch circuit 52 draws the current.

Figure 5:
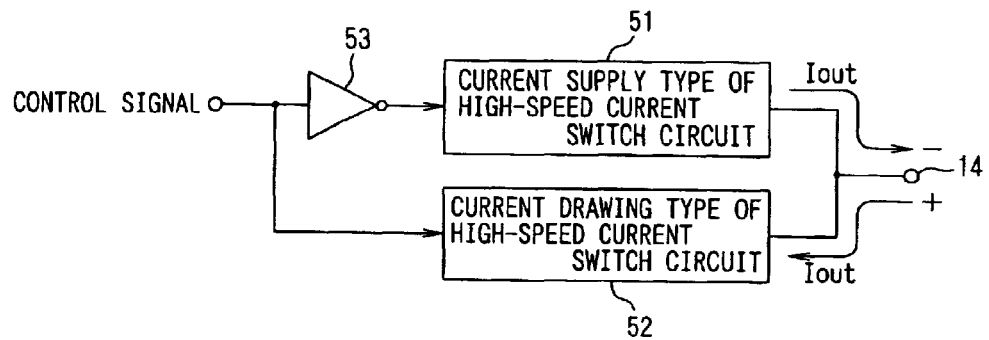
FIG. 5 is a block diagram schematically showing a configuration of an embodiment of a high-frequency current source of the present invention.
Figure 6:
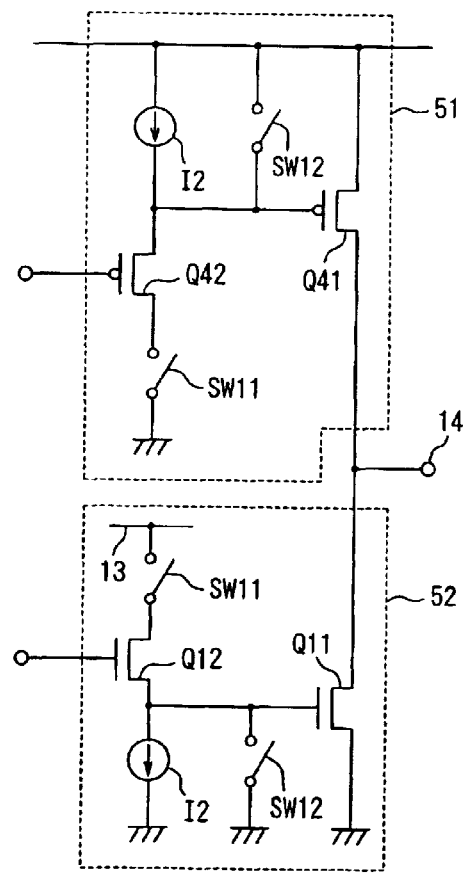
FIG. 6 is a circuit diagram showing a concrete configuration of FIG. 5.

FIG. 6 shows a concrete example of the configuration of the embodiment of the high-frequency current source shown in FIG. 5.

Figure 4:
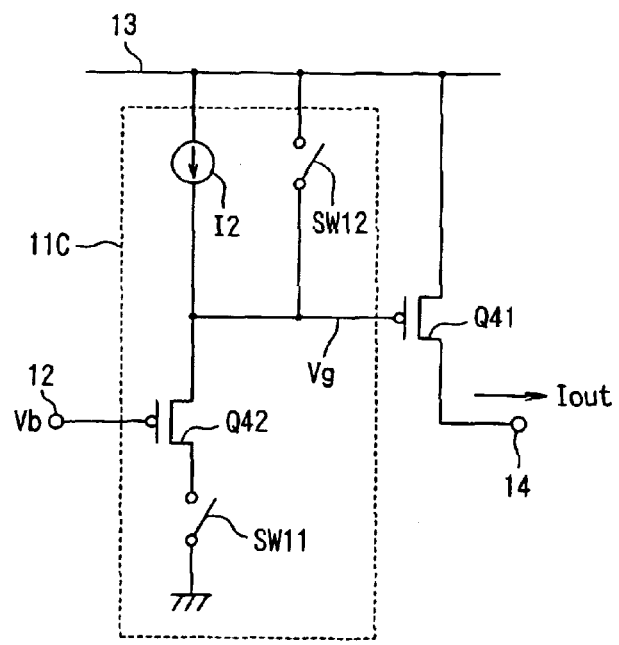
FIG. 4 is a circuit diagram showing a configuration of a fourth embodiment of the high-speed current switch circuit of the present invention.

As shown in FIG. 6, the current supply type of high-speed current switch circuit 51 is formed, e.g., of the high-speed current switch circuit shown in FIG. 4. Therefore the description of the configuration thereof will not be repeated. Also, the current drawing type of high-speed current switch circuit 52 is formed, e.g., of the high-speed current switch circuit shown in FIG. 1. Therefore the description of the configuration thereof will not be repeated.

In this embodiment, as shown in FIG. 6, both the drain of the MOS transistor Q41 constituting the high-speed current switch 51 and the drain of the MOS transistor Q11 constituting the high-speed current switch 52 are connected to a common output terminal 14, and the currents flowing through the MOS transistors Q41 and Q11 are alternatively output through the output terminal 14 (see FIG. 7).

In the embodiment of the high-frequency current source thus formed, the current supply type and current drawing type of high-speed current switch circuits 51 and 52 which operate for switching at a high speed are combined, thus making it possible to produce a high-frequency current having no direct current component and having a large current value.

The configuration of a first embodiment of another high-speed current switch circuit of the present invention will be described with reference to FIG. 8.

Figure 8:
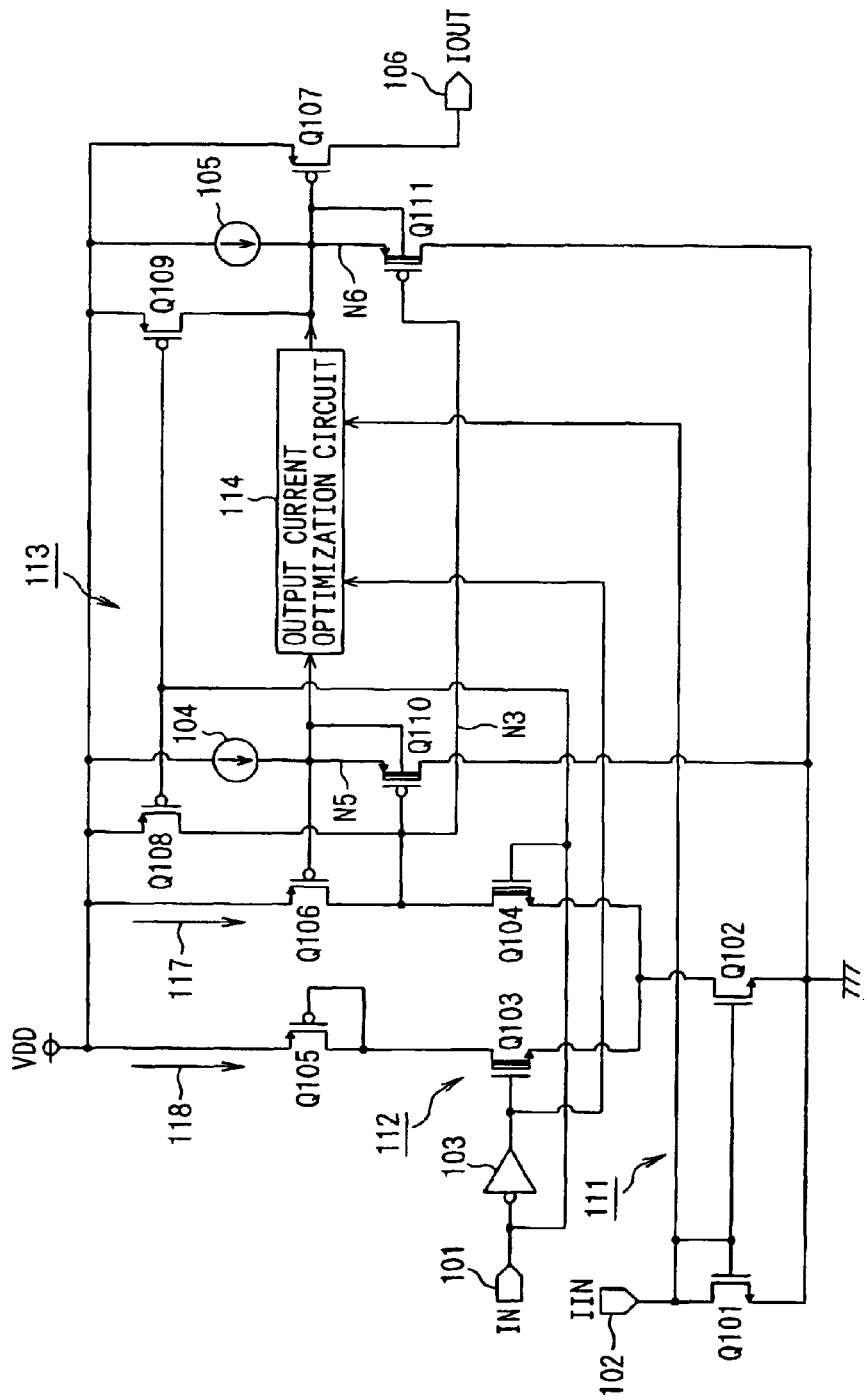
FIG. 8 is a circuit diagram showing a configuration of a first embodiment of another high-speed current switch circuit of the present invention.

FIG. 8 is a circuit diagram showing an entire configuration of the first embodiment of the high-speed current switch circuit.

The first embodiment of the high-speed current switch circuit has, as shown in FIG. 8, at least a current setting circuit 111 for externally setting a current, a selection circuit 112 for selecting one of a first current path 117 and a second current path 118 as a current path through which a current set by the current setting circuit 111 is caused to flow, a current mirror circuit 113 which provides an output current of a predetermined current ratio to the set current of a predetermined current ratio to the set current flowing through the first current path 117, and an output current optimization circuit 114.

The current setting circuit 111 is formed of a current mirror circuit which is formed of an n-type MOS transistor Q101 and an n-type MOS transistor Q102. When an externally set current IIN is set to the MOS transistor Q101, the same current as the externally set current IIN flows through the MOS transistor Q102.

The selection circuit 112 is formed of an n-type MOS transistor Q103, an n-type MOS transistor Q104, and other components. The MOS transistor Q104 is turned on when the current set by the current setting circuit 111 is caused to flow through the first current path 117, and the MOS transistor Q103 is turned on when the current set by the current setting circuit 111 is caused to flow through the second current path 118.

In the current mirror circuit 113, a p-type MOS transistor Q106 forming the first current path 117, and an p-type output MOS transistor Q107 form a current mirror relationship. Therefore, the source voltages of p-type MOS transistors Q110 and Q111 each forming a source follower are respectively applied to the gates of the MOS transistors Q106 and Q107, and the MOS transistors Q110 and Q111 are designed so that their gate-source voltages are equal to each other.

Thus the current mirror circuit 113 includes a feedback circuit (loop circuit) formed of the MOS transistor Q106 and the MOS transistor Q110, and an output circuit formed of the output MOS transistor Q107 and the MOS transistor Q111.

The output current optimization circuit 114 is arranged to optimize the rise of the output current from the current mirror circuit 113 by adjusting a phase margin of the feedback circuit included in the current mirror circuit 113.

The configuration of this embodiment of the high-speed current switch circuit will next be described in detail with reference to FIG. 8.

A current setting terminal 102 is connected to the drain of the MOS transistor Q101, and the drain of the MOS transistor Q101 is connected to each of the gates of the MOS transistors Q101 and Q102. The sources of the MOS transistors Q101 and Q102 are connected to a common connection point which is grounded.

An input terminal 101 is connected to each of the gates of MOS transistors Q104, Q108, and Q109 and is also connected to the gate of the MOS transistor Q103 through an inverter 103. The sources of the MOS transistors Q103 and Q104 are connected to a common connection point which is connected to the drain of the MOS transistor Q102.

The drain of the MOS transistor Q103 is connected to the drain of a MOS transistor Q105 which is connected to the gate of the MOS transistor Q105. Power supply voltage VDD is supplied to the source of the MOS transistor Q105.

The drain of the MOS transistor Q104 is connected to each of the drains of the MOS transistors Q106 and Q108 and to each of the gates of the MOS transistors Q110 and Q111. The gate of the MOS transistor Q106 is connected to the source of the MOS transistor Q110 and to the input side of the output current optimization circuit 114. Also, a power supply voltage VDD is supplied to the source of the MOS transistor Q106.

The gate of the MOS transistor Q108 is connected to the gate of the MOS transistor Q109, and the power supply voltage VDD is supplied to the source of the MOS transistor Q108. The drain of the MOS transistor Q110 is grounded and the power supply voltage VDD is supplied to the source of the MOS transistor Q110 through a constant current source 104.

An output from the inverter 103 and the set current IIN from the current setting terminal 102 are respectively input to the output current optimization circuit 114. An output terminal of the output current optimization circuit 114 is connected to the drain of the MOS transistor Q109, to the source of the MOS transistor Q111, and to the gate of the MOS transistor Q107.

The power supply voltage VDD is supplied to the source of the MOS transistor Q109. The drain of the MOS transistor Q111 is grounded and power supply voltage VDD is supplied to the source of the MOS transistor Q111 through a constant current source 105. The power supply voltage VDD is supplied to the source of the MOS transistor Q107 and the drain of this MOS transistor is connected to an output terminal 106.

A concrete configuration of the output current optimization circuit 114 will next be described with reference to FIG. 9.

Figure 9:
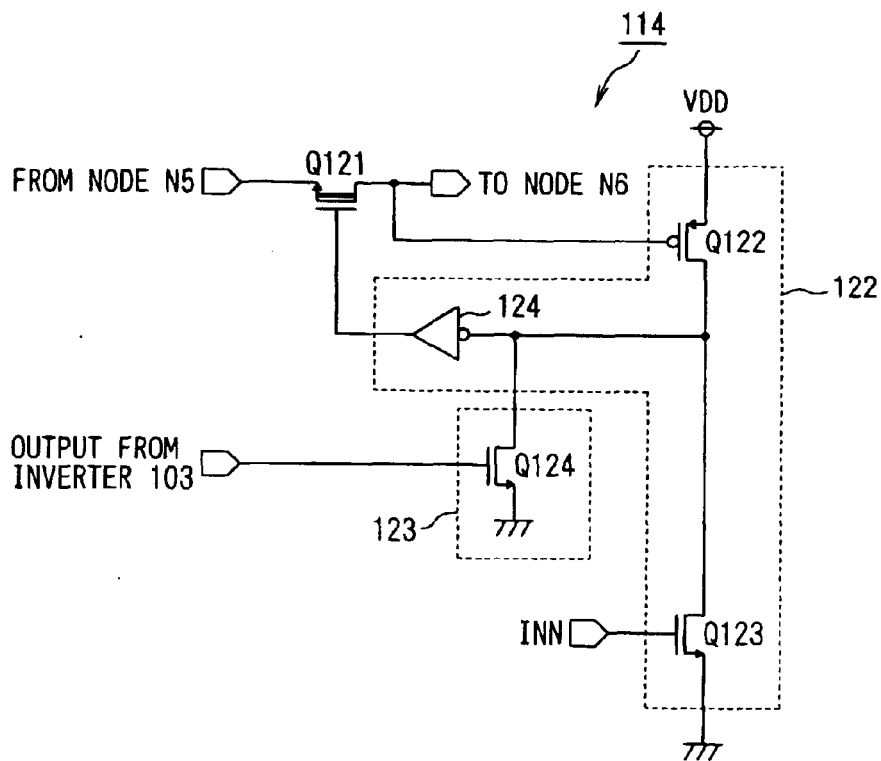
FIG. 9 is a circuit diagram showing a configuration of an output current optimization circuit shown in FIG. 8.

As shown in FIG. 9, the output current optimization circuit 114 includes an n-type MOS transistor Q121 as a variable-resistance component, a comparison circuit 122, and an initialization circuit 123.

The MOS transistor Q121 is connected between the source of the MOS transistor Q110 and the source of the MOS transistor Q111. The MOS transistor Q121 is turned off on the basis of an output from the comparison circuit 122 to function as a high resistance and is turned on on the basis of an output from the initialization circuit 123 to function as a low resistance.

The comparison circuit 122 is formed of a current comparator which is formed of MOS transistors Q122 and Q123 and an inverter 124. The comparison circuit 122 compares an output current from the output MOS transistor Q107 with a predetermined value when the output current from the transistor Q107 rises. When the output current exceeds the predetermined value, the MOS transistor Q121 is turned off.

The predetermined value for comparison in the comparison circuit 122 is, for example, a value corresponding to 90% of the final value of the output current from the MOS transistor Q107.

The initialization circuit 123 is formed of a MOS transistor Q124, and performs initialization by turning on the MOS transistor Q121 as fast as possible when the output current from the MOS transistor Q107 falls.

In more detail, the gate of the MOS transistor Q122 is connected to the source of the MOS transistor Q111 and to the gate of the MOS transistor Q107. Also, power supply voltage VDD is supplied to the source of the MOS transistor Q122.

The drain of the MOS transistor Q122 is connected to the drain of the MOS transistor Q123, to the drain of the MOS transistor Q124, and to the input side of the inverter 124. The MOS transistor Q123 determines a threshold value when the comparison circuit 122 performs comparison of the output current from the MOS transistor Q107. Input set current IIN is supplied to the gate of the MOS transistor Q123, and the source of this transistor is grounded.

The output side of the inverter 124 is connected to the gate of the MOS transistor Q121. The output from the inverter 103 is supplied to the gate of the MOS transistor Q124, and the source of this transistor is grounded.

The operation of the first embodiment thus arranged will next be described with reference to the drawings.

When input signal IN is "L" level, it is applied to the MOS transistor Q109, the MOS transistor Q109 is in the on state, and power supply voltage VDD is applied to node N6. Then power supply voltage VDD is applied to the gate of the MOS transistor Q122 of the output current optimization circuit 114 and the MOS transistor Q122 is in the off state.

Accordingly, the input side of the inverter 124 is "L" level, the output side of the same is "H" level, and the MOS transistor Q121 is in the on state. As a result, node N5 and node N6 are in a state of being short-circuited by the low-resistance MOS transistor Q121.

In the feedback circuit formed of the MOS transistors Q106 and Q110, when node N5 and node N6 are short-circuited as described above, the capacitive load forming a second-order pole becomes larger and the second-order pole is thereby set to a lower frequency, so that the phase margin is small, for example, 30° or less.

On the other hand, when input signal IN starts rising in changing from "L" level to "H" level, the MOS transistor Q104 is turned on and the gate voltage on the MOS transistor Q110 and the source voltage of the same (the potential at node N3 and the potential at node N5) then start falling according to the current value of externally set current IIN input from the current setting terminal 102.

When the potential at node N3 starts falling, the source potential (the potential at node N6) is determined by the MOS transistor Q111. This potential is the gate voltage on the MOS transistor Q107. According to this gate voltage, the output current from the MOS transistor Q107 starts rising.

The potential at node N6 is the gate voltage on the MOS transistor Q122 of the output current optimization circuit 114. Then an output current corresponding to the output current from the MOS transistor Q107 starts flowing through the MOS transistor Q122. When the output current exceeds a certain threshold value set in advance, in other words, the drain voltage of the MOS transistor Q122 exceeds the threshold voltage of the inverter 124 corresponding to the threshold value, the output from the inverter 124 becomes "L" level.

Consequently, the MOS transistor Q121 is set in the off state. Thus an open state based on the high-resistance MOS transistor Q121 results between node N5 and node N6.

When the circuit is opened between nodes N5 and N6 in this manner, the capacitive load forming the second-order pole in the feedback circuit formed of the MOS transistors Q106 and Q110 becomes smaller by being limited to the amount corresponding to the gate capacitance of the MOS transistor Q107. The second-order pole is thereby set to a higher frequency, so that the phase margin is reliably set sufficiently large, e.g., at 60° or larger.

Thereafter, when input signal IN starts falling in changing from "H" level to "L" level, this input signal IN is inverted by the inverter 103 and the inverted input signal is applied to the gate of the MOS transistor Q124 of the output current optimization circuit 114. The MOS transistor Q124 is thereby turned on to immediately set the input side of the inverter 124 to "L" level and the inverter 124 then initializes the MOS transistor Q121 by setting the same in the on state.

Figure 10:
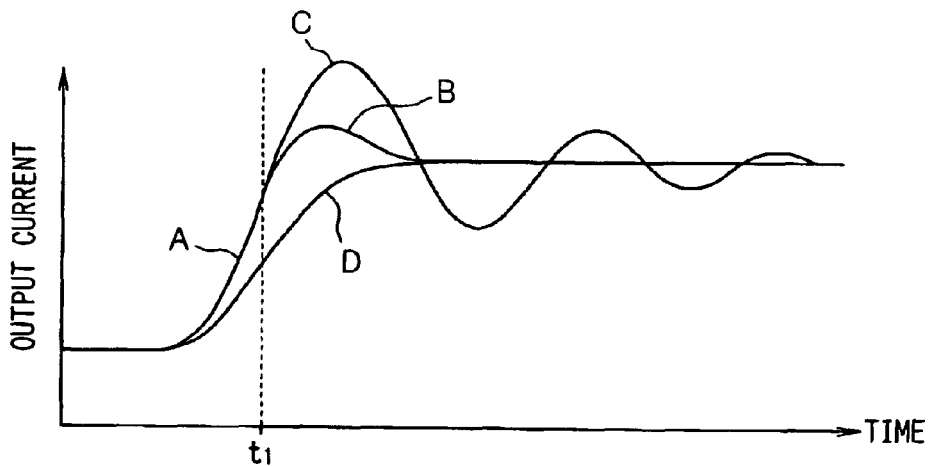
FIG. 10 is a diagram for explaining an output current characteristic of the first embodiment shown in FIG. 8.

Changes in the output current from the MOS transistor Q107 in the above-described operation are as shown in a combined state in FIG. 10. A description will be made of this.

That is, when the output current from MOS transistor Q107 rises, node N5 and node N6 are short-circuited by turning on the MOS transistor Q121 until a predetermined intermediate current value (e.g., about 90% of the final value of the output current) is reached. As a result, the output current rise period is shortened, as indicated by a curve A in FIG. 10.

On the other hand, at a time t1 when the output current overshoots by rising to the intermediate current value, the circuit is opened between node N5 and N6 by turning off the MOS transistor Q121, that is, the phase margin of the feedback circuit formed of the MOS transistors Q106 and 110 is reliably set sufficiently large. As a result, the overshoot of the output current is suppressed, as indicated by a curve B in FIG. 10.

In FIG. 10, a curve C represents an example of the output current in a case where the MOS transistor Q121 is maintained in the on state, and a curve D represents an example of the output current in a case where the MOS transistor Q121 is maintained in the off state.

According to this first embodiment, as described above, it is possible to shorten the output current rise time and to suppress the overshoot without increasing the consumption current.

Also, according to this first embodiment, initialization is performed when the output current falls, so that, even though high-speed on/off control of the output current according to the input signal is repeated, no change in output current rise characteristic appears as a result of the repetition.

The configuration of a second embodiment of the high-speed current switch circuit of the present invention will next be described with reference to FIG. 11.

Figure 11:
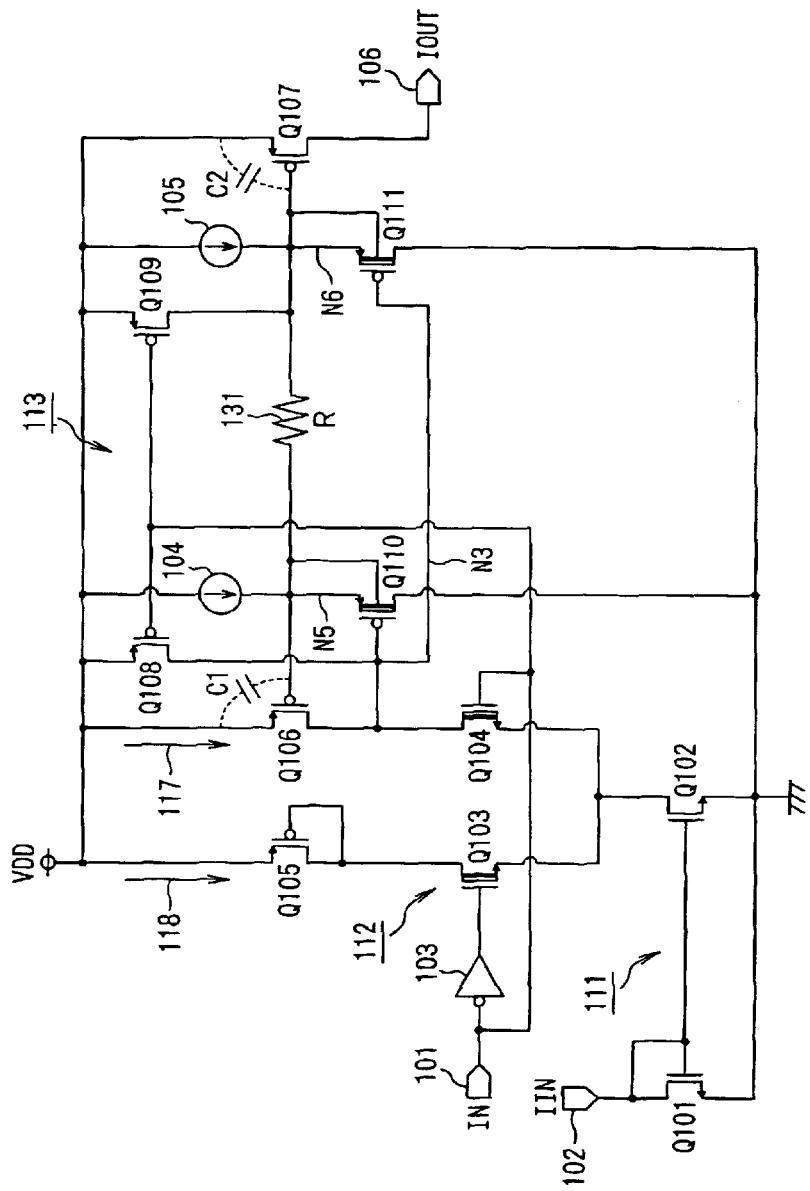
FIG. 11 is a circuit diagram showing a configuration of a second embodiment of another high-speed current switch circuit of the present invention.

The second embodiment of the high-speed current switch circuit is such that the output current optimization circuit 114 in the first embodiment is replaced with a resistance element 131 having a predetermined resistance value, as shown in FIG. 11. The resistance element 131 is formed, e.g., of polysilicon.

In other respects, excepting the output current optimization circuit 114, the configuration of the second embodiment is the same as that of the first embodiment shown in FIG. 8. Therefore, the same components are indicated by the same reference characters, and the description for them will not be repeated.

The output current optimization circuit 114 of the first embodiment is replaced with the resistance element 131 in the second embodiment for the following reason.

That is, when node N5 and node N6 are short-circuited, the output current from the MOS transistor Q107 rises fast but the overshoot is large, as indicated by the curve C in FIG. 10. Conversely, when the circuit is opened between node N5 and node N6, the output current from the MOS transistor Q107 rises slowly but the overshoot is small, as indicated by the curve D in FIG. 10.

However, if the resistance element 131 having a predetermined resistance value is inserted (connected) between node N5 and N6, the phase margin of the feedback circuit formed of the MOS transistors Q106 and Q110 is adjusted. As a result, the output current rise characteristic of the MOS transistor Q107 is obtained as an intermediate characteristic such as indicated by a curve A in FIG. 12, and the overshoot is suppressed within an allowable range while the rise speed is increased.

Figure 12:
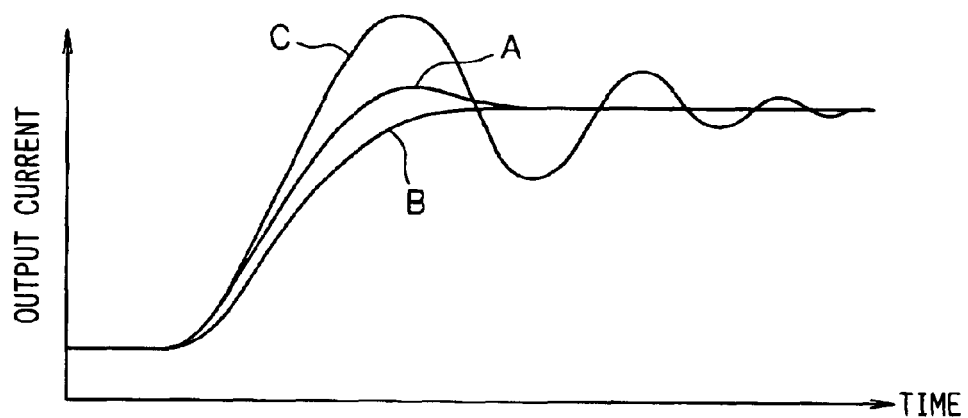
FIG. 12 is a diagram for explaining an output current characteristic of the second embodiment shown in FIG. 11.

The relationship between the curves A, B, and C in FIG. 12 and the corresponding phase margin θ will be as described below. That is, the curve A represents a case where 60°>θ>30°, the curve B a case where θ>60°, and the curve C a case where θ<30°.

For example, in a case where this second embodiment is applied to a laser diode drive circuit in a CD-R/RW system, 5% at the maximum is allowed as an amount of overshoot of the output current. Therefore, the circuit can be designed in such a manner that the output current rise time is minimized by adjusting the phase margin by means of the resistance element 131 while the overshoot is limited to 5% or less. Such a design can be achieved without changing any consumption current in the circuit.

A concrete method of adjusting the phase margin of the feedback circuit formed of the MOS transistors Q106 and Q110 will next be described with reference to FIG. 13.

Figure 13:
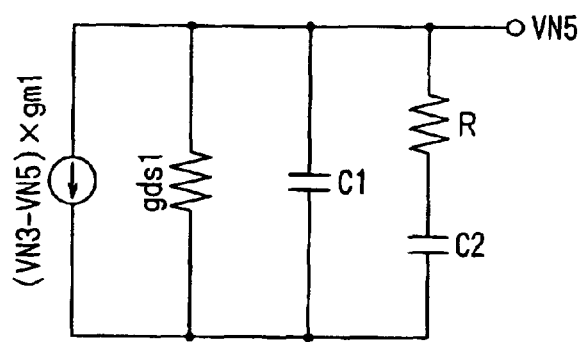
FIG. 13 is an equivalent circuit diagram of a feedback circuit of the second embodiment shown in FIG. 11 when an output current rises.

FIG. 13 is an equivalent circuit diagram of node N5 in the circuit shown in FIG. 11. If the voltage at node N3 is VN3 and the voltage at node N5 is VN5, a transfer function from this equivalent circuit is as shown by the following equation (8):

$$VN5/VN3=(gm1/C1)\times\{[S+(1/(C2\times R))]/[S^2+S((C2\times R\times(gm1+gds1)+C1+C2)/(C1\times C2\times R))+((gm1+gds1)/(C1\times C2\times R))]\} \quad (8)$$

where S is a complex frequency variable, gm1 is the transfer conductance of the MOS transistor Q110, C1 is the gate capacitance of the MOS transistor Q106, R is the resistance value of the resistance element 131, gds1 is the output conductance of the MOS transistor Q110, and C2 is the gate capacitance of the MOS transistor Q107.

If gm1>>gds1, the following equation (9) is obtained from equation (8):

$$VN5/VN3=(gm1/C1)\times\{[S+(1/(C2\times R))]/[S^2+S((gm1/C1)+(C1+C2)/(C1\times C2\times R))+(gm1)/(C1\times C2\times R)]\} \quad (9)$$

According to equation (9), a second-order low-pass filter (LPF) having a zero point is formed.

The first-order polar frequency $\omega_0$ and the zero-point frequency $Z_{ero}$ are obtained from equation (9) as shown by the following equations (10) and (11):

$$\omega_0=\sqrt{(gm1/(C1\times C2\times R))} \quad (10)$$

$$Z_{ero}=1/(C2\times R) \quad (11)$$

The phase is rotated through 90° by the first-order polar frequency $\omega_0$ but returned by the zero-point frequency $Z_{ero}$. Therefore the first-order polar frequency $\omega_0$ and the zero-point frequency $Z_{ero}$ can be adjusted through the resistance R of the resistance element 131. Consequently, the phase margin of the feedback circuit can be adjusted by adjusting the resistance value of the resistance element 131.

In the second embodiment, the circuit is formed as shown in FIG. 11. In the circuit thus formed, even when the step response of the feedback circuit overshoots, the response of the output current is finally determined at node N6. Therefore, an overshoot cannot appear easily and immediately at node N6 from the response of the feedback circuit because of the low-pass filter effect of the resistance element 131 and the capacitance at node N6.

According to the second embodiment, as described above, a resistance element is provided to enable adjustment of the phase margin without increasing the consumption current in the circuit. Therefore it is possible to minimize the output current rise time while suppressing the overshoot as effectively as possible.

An embodiment of the oscillator of the present invention will next be described with reference to FIG. 14.

Figure 14:
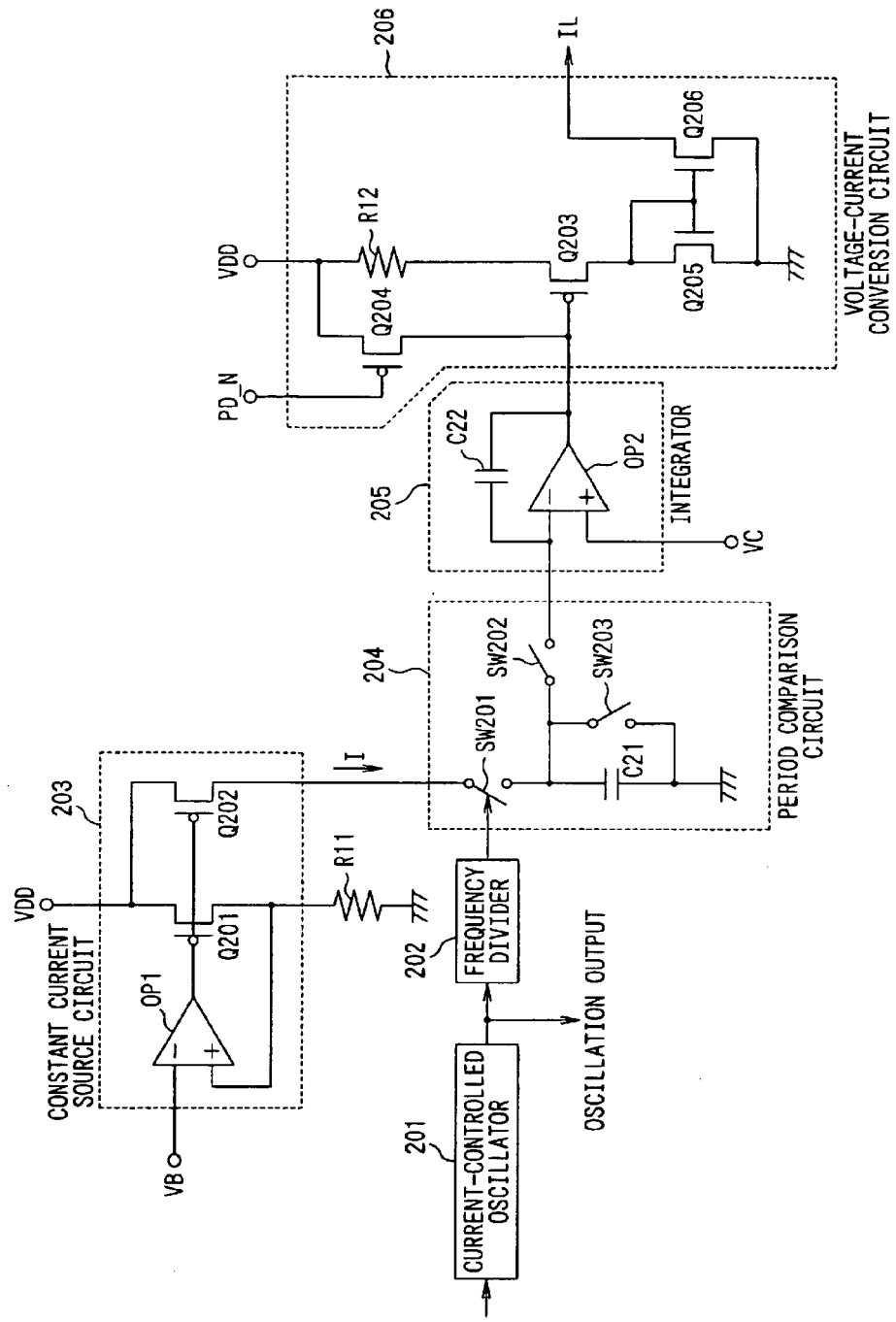
FIG. 14 is a circuit diagram (block diagram) showing a configuration of an embodiment of an oscillator of the present invention.

As shown in FIG. 14, the embodiment of the oscillator of the present invention has a current-controlled oscillator 201, a frequency divider 202, a period comparison circuit 204, an integrator 205, and a voltage-current conversion circuit 206 connected in series, an output current from the voltage-current conversion circuit 206 in the final stage is fed back to the input side of the current-controlled oscillator 201 in the initial stage, and an output from the current-controlled oscillator 201 is taken out as an oscillation output.

In this embodiment, a constant current source circuit 203 which supplies a constant current I to the period comparison circuit 204 is provided and a reference voltage VC not influenced by variation in power supply voltage or the like is supplied to the integrator 205 to stabilize the oscillation output. Preferably, the above-described components are formed in an integrated circuit on a semiconductor substrate for example.

The current-controlled oscillator 201 corresponds to the oscillation means, and the period comparison circuit 204 corresponds to the charge means. Also, the integrator 205 and the voltage-current conversion circuit 206 correspond to the control means.

The configuration of each section of this embodiment will next be described in detail.

The current-controlled oscillator 201 is an oscillator (current-frequency conversion circuit) in which the oscillation frequency is controlled by current IL output from the voltage-current conversion circuit 206. The frequency divider 202 is arranged to divide (reduce) the oscillation frequency of the current-controlled oscillator 201 at a division ratio of 1/N.

The constant current source circuit 203 is arranged to produce, on the basis of a bandgap voltage VB generated by a bandgap reference circuit (not shown) and the voltage across a resistor (external resistor) R11, constant current I to be supplied to the period comparison circuit 204.

Accordingly, as shown in FIG. 14, the constant current source circuit 203 is constituted by an operational amplifier OP1, PMOS transistors Q201 and Q202, and the resistor R11. That is, the operational amplifier OP1 is supplied-with, through its minus input terminal, the above-mentioned bandgap voltage VB and is also supplied with, through its plus input terminal, the voltage generated across the resistor R11. An output terminal of the operational amplifier OP1 is connected to each of the gates of the PMOS transistors Q201 and Q202.

Further, power supply voltage VDD is applied to the source of the PMOS transistor Q201. The drain of the PMOS transistor Q201 is connected to one end of the resistor R11 and to the plus input terminal of the operational amplifier OP1. The other end of the resistor R11 is grounded. The source of the PMOS transistor Q202 is connected to the source of the PMOS transistor Q201, power supply voltage VDD is applied to the source, and the drain of the PMOS transistor Q202 is connected to a switch SW201 of the period comparison circuit 204.

The period comparison circuit 204 is arranged to charge a capacitor C21 with constant current I supplied from the constant current source circuit 203 during one-half period of an output from the frequency divider 202 and to transfer the electric charge stored in the capacitor C21 to the integrator 205 in the following stage in a period corresponding to a quarter of the other half period.

Accordingly, as shown in FIG. 14, the period comparison circuit 204 is constituted by a capacitor C21, a charge switch SW201, a transfer switch SW202, and a discharge switch SW203. One end of the capacitor C21 is connected to the drain of the PMOS transistor Q202 through the charge switch SW201 and to a minus input terminal of an operational amplifier OP2 of the integrator 205 through the transfer switch SW202. The other end of the capacitor C21 is grounded. The discharge switch SW203 is connected to the two ends of the capacitor C21.

The integrator 205 is arranged to perform an integrating operation described below on the basis of the electric charge stored in the capacitor C21 of the period comparison circuit 204 and the reference voltage VC produced as a reference value by the bandgap reference circuit (not shown), and to output an integrated output to the voltage-current conversion circuit 206.

Accordingly, as shown in FIG. 14, the integrator 205 is constituted by the operational amplifier OP2 and an integrating capacitor C22. The capacitor C22 is connected to a minus input terminal and an output terminal of the operational amplifier OP2. Electric charge stored in the capacitor C21 is applied to the minus input terminal, and the above-mentioned reference voltage VC is applied to the plus input terminal. An output terminal of the operational amplifier OP2 is connected to the gate of a PMOS transistor Q203 of the voltage-current conversion circuit 206.

The voltage-current conversion circuit 206 is supplied with an input voltage which is an output voltage from the integrator 205, outputs current IL proportional to this input voltage for example, and feeds back this output current IL to the input side of the current-controlled oscillator 201.

Accordingly, as shown in FIG. 14, the voltage-current conversion circuit 206 is constituted by a low resistor R12, the PMOS transistor Q203 for performing voltage-current conversion, a PMOS transistor Q204 for performing power-down control, and NMOS transistors Q205 and Q206 forming a current mirror.

The gate of the PMOS transistor Q203 is connected to the output terminal of the operational amplifier OP2, and power supply voltage VDD is applied to the source of this transistor through the resistor R12. The drain of the PMOS transistor Q203 is connected to the drain of the NMOS transistor Q205. An inversion signal PD_N of a power-down signal PD is applied to the gate of the PMOS transistor 0204, power supply voltage VDD is applied to the source of this transistor, and the drain of this transistor is connected to the gate of the PMOS transistor Q203.

The NMOS transistor Q205 has its drain connected to its gate and has its gate connected to the gate of the NMOS transistor Q206. The source of the NMOS transistor Q205 is grounded. The NMOS transistor Q206 has its source grounded and has output current IL taken out through its drain. Output current IL is fed back to the current-controlled oscillator 201.

A concrete configuration of the period comparison circuit 204 shown in FIG. 14 will next be described with reference to FIG. 15.

Referring to FIG. 15, the switch SW201 shown in FIG. 14 is constituted by PMOS transistors Q211 and Q212, and the switches SW202 and SW203 are respectively constituted by the NMOS transistors Q213 and Q214.

That is, the PMOS transistor Q211 has its source connected to the output section of the constant current source circuit 203 and has its drain grounded. An output from the frequency divider 202 obtained by dividing the frequency of the output from the current-controlled oscillator 201 by N is applied as a control voltage CHRG to the gate of the PMOS transistor Q211 (see FIG. 16(A)) to perform on/off control of the PMOS transistor Q211.

Also, the PMOS transistor Q212 has its source connected to the output section of the constant current source circuit 203 and its drain connected to one end of the capacitor C21. Control voltage CHRG, i.e., the output from the frequency divider 202, is inverted and applied as a control voltage CHRGN to the gate of the PMOS transistor Q212 (see FIG. 16(B)) to perform on/off control of the PMOS transistor Q212.

Further, the one end of the capacitor C21 is connected to the minus input terminal of the operational amplifier OP2 of the integrator 205 through the NMOS transistor Q213, while the other end of the capacitor C21 is grounded. On/off control of the NMOS transistor Q213 is performed by means of a control voltage INTEG such as shown in FIG. 16(C), which is applied to the gate of the NMOS transistor Q213.

Also, the NMOS transistor Q214 is connected to the two ends of the capacitor C21. On/off control of the NMOS transistor Q214 is performed by means of a control voltage DISCHG such as shown in FIG. 16(D), which is applied to the gate of the NMOS transistor Q214.

The above-mentioned control voltage INTEG is obtained in such a manner that the above-mentioned control voltage CHRGN, a voltage obtained by dividing the frequency of the output from the current-controlled oscillator 201 by 2N, and an inverted voltage obtained by inverting a voltage which is obtained by dividing the frequency of the output from the current-controlled oscillator 201 by 4N are applied to an unillustrated three-input AND gate, and control voltage INTEG is obtained from an output terminal of the AND gate.

Also, the above-mentioned control voltage DISCHG is obtained in such a manner that the above-mentioned control voltage CHRGN, an inverted voltage obtained by inverting a voltage which is obtained by dividing the frequency of the output from the current-controlled oscillator 201 by 2N, and an inverted voltage obtained by inverting a voltage which is obtained by dividing the frequency of the output from the current-controlled oscillator 201 by 4N are applied to an unillustrated three-input AND gate, and control voltage DISCHG is obtained from an output terminal of the AND gate.

The operation of the thus-formed oscillator in this embodiment will next be described with reference to the drawings.

When the oscillator is in an operation halt state (power down state), PD_N=N and the PMOS transistor Q204 shown in FIG. 14 is therefore maintained in the on state by inversion (PD_N) of the power-down signal. At this moment, the output Vout from the integrator 205 is, for example, the power supply voltage 5 V. Therefore the PMOS transistor Q203 is in the off state, no current flows through the same, and the output current IL from the NMOS transistor Q206 is zero.

On the other hand, when the oscillator is in an operation start condition (power down cancellation) PD_N=L and the PMOS transistor Q204 is therefore maintained in the off state by inversion (PD_N) of the power-down signal.

By this start of operation of the oscillator, the current-controlled oscillator 201 starts operating at a lower frequency and the oscillation output therefrom is input to the frequency divider 202. The frequency of the input is divided by N.

In the period comparison circuit 204, the switch SW201 is closed during the one-half period of the output from the frequency divider 202 (corresponding to the period from time t2 to time t3 in FIG. 16). During this period, the capacitor C21 is charged with constant current I supplied from the constant current source circuit 203. When this charge is completed, the voltage across the capacitor C21 becomes V1.

The switch SW202 is closed in a period corresponding to a quarter of the other half period of the output from the frequency divider 202 (corresponding to the period from time t4 to time t5 in FIG. 16) and electric charge stored in the capacitor C21 is transferred to the integrator 205 in the following stage during this period.

On the basis of this transfer of the electric charge stored in the capacitor C21, charging on the integrating capacitor C22 of the integrator 205 is started and the output Vout from the integrator 205 therefore starts falling gradually from 5V. With this change, a current starts flowing through the PMOS transistor Q203, thereby increasing output current IL from the NMOS transistor Q206.

This output current IL is fed back to the current-controlled oscillator 201 and the frequency of the current-controlled oscillator 201 is controlled by means of current IL.

When in the operational amplifier OP2 of the integrator 205 a voltage V2 accompanying the electric charge stored in the capacitor C21 and applied to the minus input terminal and reference voltage VC applied to the plus input terminal become V1=V2=VC, transfer of the electric charge from the capacitor C21 is completed, thereby stabilizing the system of this oscillator. That is, the output Vout from the integrator 205 changes until the system of the oscillator is stabilized, becomes settled at the operating point at which V1=V2=VC.

The operation of the period comparison circuit 204 will be described concretely with reference to FIGS. 15 and 16.

During the period from time t1 to time t2, control voltage DISCHG is H level as shown in FIG. 16(D), the NMOS transistor Q214 is therefore turned on, and electric charge stored in the capacitor C21 is discharged. Also during this period, since control voltage CHRG is L level as shown in FIG. 16(A), the PMOS transistor Q211 is in the on state and constant current I from the constant current source circuit 203 flows.

Next, during the period from time t2 to time t3, control voltage CHRGN is L level as shown in FIG. 16(B) and the PMOS transistor Q212 is therefore turned on. Consequently, constant current I from the constant current source circuit 203 flows into the capacitor C21 to charge the capacitor C21 and the voltage V1 across the capacitor C21 is increased as shown in FIG. 16(E).

At time t3, control voltage CHRGN changes from L level to H level as shown in FIG. 16(B), the PMOS transistor Q212 is turned off, and charging on the capacitor C21 is stopped. Then the voltage V1 across the capacitor C21 becomes constant, as shown in FIG. 16(E).

Thereafter, during the period from time t4 to time t5, control voltage INTEG becomes H level as shown in FIG. 16(C) and the NMOS transistor Q213 is therefore turned on. Consequently, the voltage V1 across the capacitor C21 is applied to the minus input terminal of the operational amplifier OP2 of the integrator 205 and the integrator 205 therefore performs the above-described integrating operation.

Next, during the period from time t6 to time t7, control voltage DISCHG becomes H level as shown in FIG. 16(D), the NMOS transistor Q214 is therefore turned on, and the capacitor C21 is discharged. Thereafter the above-described operation is repeated.

The process of obtaining the oscillation frequency in this embodiment will be described with reference to the drawings.

In this embodiment, as described above, control current IL output from the voltage-current conversion circuit 206 is determined on the basis of the output Vout from the integrator 205, and the oscillation frequency of the oscillator is stabilized when V1=V2=VC is established.

Switching of the PMOS transistor Q212 is based on control voltage CHRGN obtained by inverting control voltage CHRG obtained by the frequency divider 202 dividing the oscillation frequency f of the current-controlled oscillator 201 by N.

Therefore, if the period of the frequency of control voltage CHRG is Ts as shown in FIG. 16, the PMOS transistor Q212 is switched in Ts, and the period during which the PMOS transistor Q212 is on is Ts/2 (second).

Then, if the voltage across the capacitor C21 is V1, the charge Q stored in the capacitor C21 by charging with constant current I from the constant current source circuit 203 during the period Ts/2 when the PMOS transistor Q212 is on is as shown by the following equation (12):

$$Q = I \times (Ts/2) = C21 \times V1 \qquad (12)$$

When the oscillator is in a stabilized state such as described above, and when V1=V2=VC, the switching time Ts is as shown by the following equation (13):

$$Ts = ((C21 \times VC)/I) \times 2 \qquad (13)$$

The oscillation frequency f of the current-controlled oscillator 201 and the period 1/T thereof are in the relationship f=1/T. If the number by which the frequency is divided is N, the switching time Ts is as shown by the following equation (14):

$$Ts = N \times T \qquad (14)$$

From equation (13) and equation (14), the following equation (15) is obtained:

$$N \times T = ((C21 \times VC)/I) \times 2 \qquad (15)$$

This equation (15) is solved for T to obtain the following equation (16):

$$T = ((C21 \times VC)/I) \times (2/N) \qquad (16)$$

Equation (16) is solved for the oscillation frequency f by using the relationship f=1/T to obtain the oscillation frequency f (Hz) as shown by the following equation (17):

$$f = (I/(C21 \times VC)) \times (N/2) \qquad (17)$$

In the oscillator of this embodiment, as described above, the oscillation frequency is determined by equation (17) shown above, and constant current I is produced by voltage-current conversion from the external resistor R11 and the bandgap voltage. Therefore it is possible to obtain the stabilized current value without dependence on the power supply voltage or the operating temperature. Causes of variation of oscillation frequency can be thereby reduced in comparison with the conventional circuit. Consequently, it is possible to improve the accuracy and stability of the oscillation frequency.

The embodiment has been described with respect to a case where only one external resistor R11 is used for determination of the oscillation frequency. However, the arrangement may be such that a plurality of external resistors R11 differing in resistance value are provided and one of the plurality of external resistors R11 is selected to perform oscillation at a desired oscillation frequency.

Also, while the embodiment has been described with respect to a case where only one capacitor C21 is provided in the period comparison circuit 204, the arrangement may alternatively be such that the value of the capacitor can be changed by a register or the like. In such a case, the oscillation frequency can be conveniently changed through setting of the register.

Further, while the embodiment has been described by assuming that the frequency divider 202 has a fixed division ratio, the arrangement may alternatively be such that the division ratio of the frequency divider 202 can be changed by a register or the like. In such a case, the oscillation frequency can be conveniently changed through setting of the register.

Also in the above-described embodiment, the frequency divider 202 is provided. However, in a case where the level of the oscillation output of the current-controlled oscillator 201 is comparatively low, switching control of the frequency comparison circuit 204 or the like can be performed with stability. In such a case, therefore, the frequency divider 202 can be removed.

Also, while in the above-described embodiment the current-controlled oscillator is provided as the oscillation means, it maybe replaced with a voltage-controlled oscillator (VCO). In such a case, the voltage-current conversion circuit 206 shown in FIG. 14 can be removed.

Also, while the MOS transistor for power down is used in the above-described embodiment, the operation can be performed without using the MOS transistor for power down.

A first embodiment of the high-frequency superimposition circuit will next be described with reference to FIG. 17.

Figure 17:
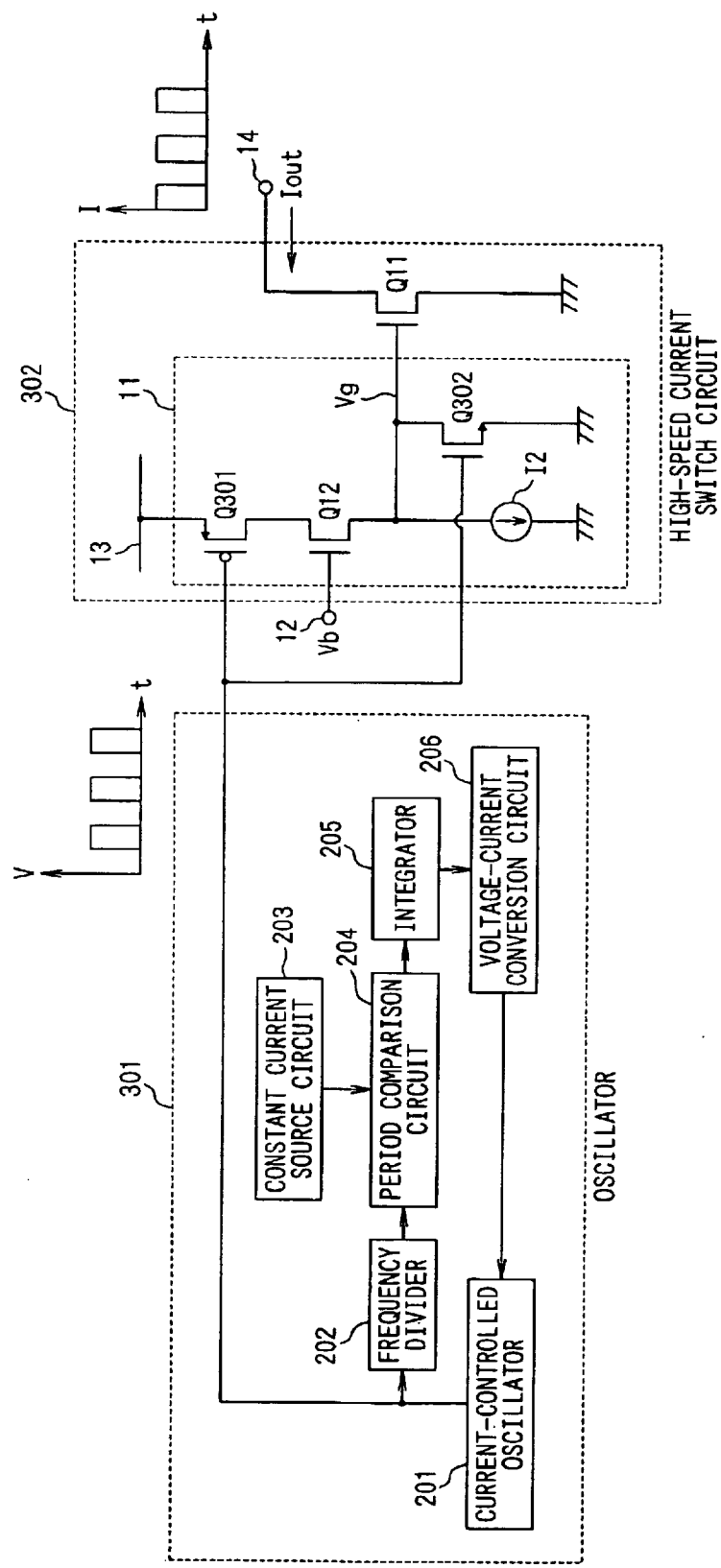
FIG. 17 is a diagram showing a configuration of a first embodiment of a high-frequency superimposition circuit of the present invention.

As shown in FIG. 17, the first embodiment of the high-frequency superimposition circuit is formed of an oscillator 301 and a high-speed current switch circuit 302 in which switching control of an output current is performed on the basis of an output voltage from the oscillator 301. A laser diode (not shown) is connected to the high-speed current switch circuit 302, and a current flowing through the laser diode is controlled.

The oscillator 301 may be an ordinary oscillator. However, an oscillator shown in FIG. 14 is preferred as the oscillator 301.

Accordingly, the oscillator 301 has, as shown in FIG. 17, a current-controlled oscillator 201, a frequency divider 202, a period comparison circuit 204, an integrator 205, and a voltage-current conversion circuit 206 connected in series, an output current from the voltage-current conversion circuit 206 in the final stage is fed back to the input side of the current-controlled oscillator 201 in the initial stage, and an output from the current-controlled oscillator 201 is taken out as an oscillation output. The period comparison circuit 204 is supplied with a constant current from a constant current source circuit 203.

Thus, the configuration of the oscillator 301 is the same as that of the oscillator shown in FIG. 14, whose concrete configuration and operation have already been described. Therefore the same description will not be repeated.

The high-speed current switch circuit shown FIG. 1 is used as the high-speed current switch circuit 302. In this high-speed current switch circuit 302, however, the switches SW11 and SW12 of the high-speed current switch circuit shown in FIG. 1 are replaced with a p-type MOS transistor Q301 and an n-type MOS transistor Q302, respectively. Also, the output voltage from the oscillator 301 is applied to each of the gates of the MOS transistors Q301 and Q302 to perform switching control.

In other respects, the configuration of the high-speed current switch circuit 302 is the same as that of the high-speed current switch circuit shown in FIG. 1. Therefore the same components are indicated by the same reference characters, and the description for them will not be repeated.

In the first embodiment thus formed, an oscillation frequency can be obtained from the oscillator 301 with stability. Also, the high-speed current switch circuit 302 can operate at a high speed. In the first embodiment, therefore, the laser diode can be driven at a high speed with stability.

The first embodiment has been described with respect to a case where the high-speed current switch circuit shown in FIG. 1 is used as the high-speed current switch circuit 302. However, one of the high-speed current switch circuits shown in FIGS. 2, 3, and 4 may alternatively be used. Further, the high-frequency current source shown in FIG. 6 may be used.

A second embodiment of the high-frequency superimposition circuit will next be described with reference to FIG. 18.

Figure 18:
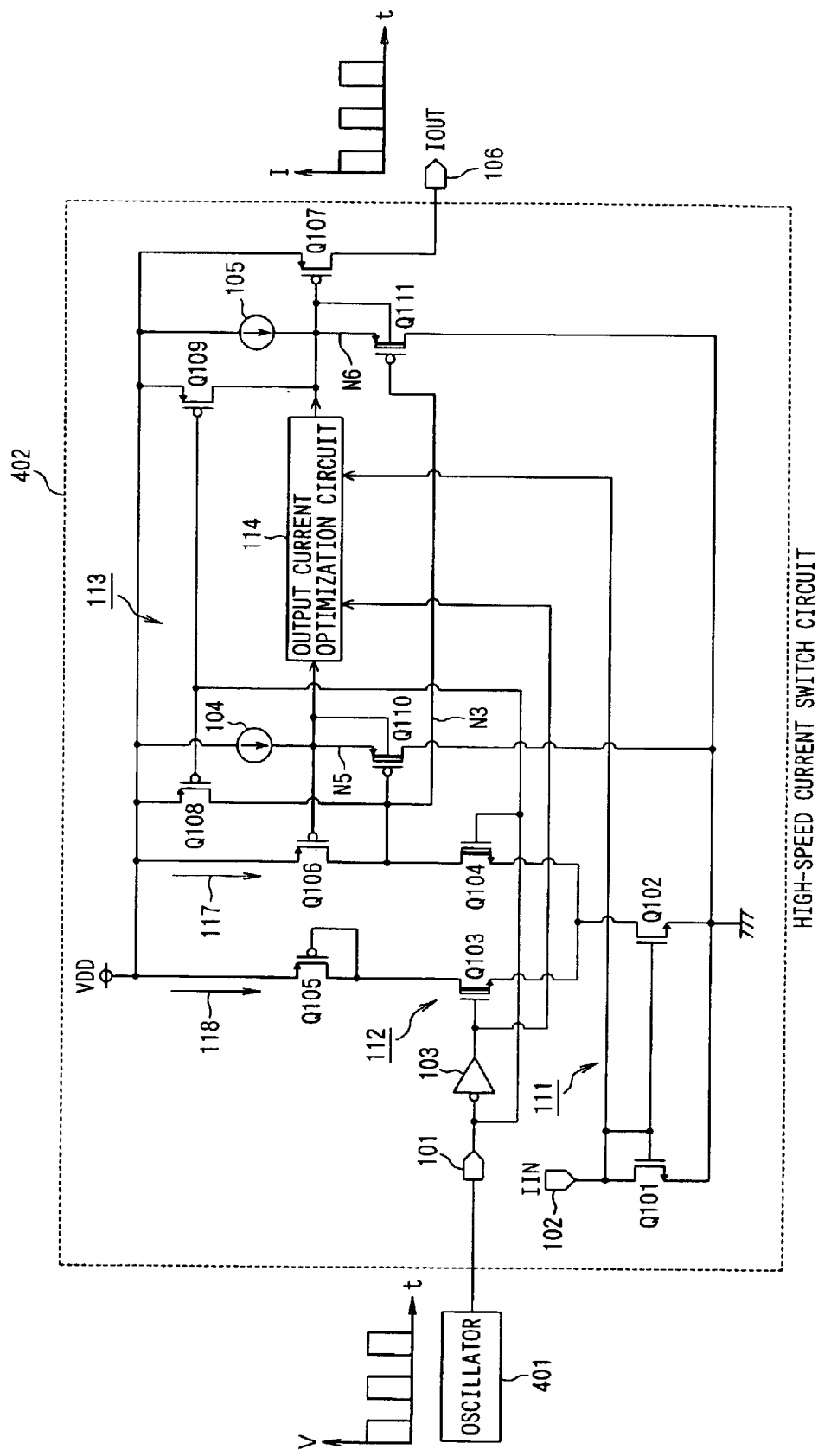
FIG. 18 is a diagram showing a configuration of a second embodiment of the high-frequency superimposition circuit of the present invention.
Figure 19:
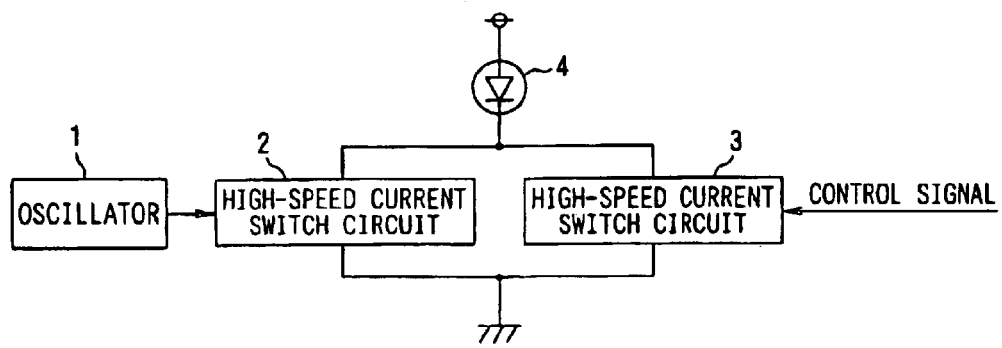
FIG. 19 is a block diagram of a conventional laser diode drive circuit.
Figure 20:
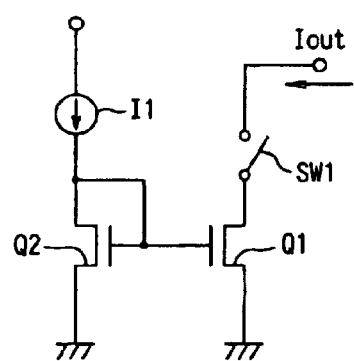
FIG. 20 is a circuit diagram of a conventional high-speed current switch circuit.
Figure 21:
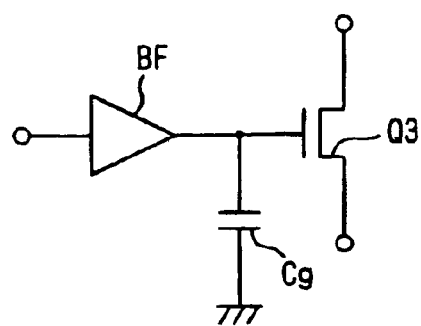
FIG. 21 is a diagram showing a concrete configuration of a switch in FIG. 20.

As shown in FIG. 18, the second embodiment of the high-frequency superimposition circuit is formed of an oscillator 401 and a high-speed current switch circuit 402 in which switching control of an output current is performed on the basis of an output voltage from the oscillator 401. A laser diode (not shown) is connected to the high-speed current switch circuit 402, and a current flowing through the laser diode is controlled.

The oscillator 401 may be an ordinary oscillator or the same oscillator as the oscillator 301 shown in FIG. 17.

The high-speed current switch circuit shown in FIG. 8, in which an overshoot is reduced, is used as the high-speed current switch circuit 402. An output voltage from the oscillator 401 is applied to the input terminal 101 of the high-speed current switch circuit 402.

The configuration of the high-speed current switch circuit 402 is the same as that of the high-speed current switch circuit shown in FIG. 8. Therefore the same components are indicated by the same reference characters, and the description for them will not be repeated.

In the second embodiment thus formed, the output current rise time of the high-speed current switch circuit 402 can be shortened and an overshoot of the output current can be suppressed. In the second embodiment, therefore, start-up of the operation of the laser diode can be completed in a shorter time and the laser diode can be driven with stability.

The second embodiment has been described with respect to a case where the high-speed current switch circuit shown in FIG. 8 is used as the high-speed current switch circuit 402. However, the high-speed current switch circuit shown in FIG. 11 may alternatively be used.

Industrial Applicability

In a high-speed current switch circuit of the present invention, as described above, control of the voltage input to an output transistor is performed by using a source follower. Therefore the output transistor can be made to operate for switching at a high speed even in a case where a large current is caused to flow through the output transistor.

Also, in the high-speed current switch circuit of the present invention, a bias voltage generation circuit is provided and a transistor included in the bias voltage generation circuit and the output transistor have a current mirror relationship. In this case, therefore, the current flowing through the output transistor can be set as desired through the size ratio of the two transistors.

Further, in the high-speed current switch circuit of the present invention, the bias voltage generation circuit includes a stabilization circuit for stabilizing a generated bias voltage. In this case, therefore, variation in the bias voltage from the source follower when the source follower performs an on/off operation can be reduced.

In a high-frequency current source of the present invention, a current supply type of high-speed current switch circuit and a current drawing type of high-speed current switch circuit which operate for switching at a high speed are combined, thereby enabling generation of a high-frequency current having no direct current component.

In another high-speed current switch circuit of the present invention, the output current rise time can be shortened and an overshoot of the output current can be suppressed.

Further, in an oscillator of the present invention, an oscillation frequency can be determined on the basis of the value of a constant current for charging a capacitor and a predetermined reference value required when a current or a voltage for controlling the oscillation frequency is generated. It is possible to obtain these values while minimizing the degree to which they are influenced by variation in power supply voltage or operating temperature.

In the oscillator of the present invention, therefore, the influence of variation in power supply voltage or operating temperature on the oscillation frequency can be minimized to stabilize the oscillation frequency as well as to improve the oscillation accuracy.

With a high-frequency superimposition circuit of the present invention, a laser diode can be operated at a high speed with stability.

Further, with a high-frequency superimposition circuit of the present invention, faster start-up of the operation of a laser diode can be achieved and the laser diode can be driven with stability.

What is claimed is:

1. A high-speed current switch circuit, comprising:
   an output transistor which switches and outputs a current and has an input terminal, an output terminal, and a source terminal; and
   a control circuit for controlling said output transistor, said control circuit comprising a source follower circuit and a first switch which is connected between said source follower circuit and a power supply;
   said source follower circuit comprising a second transistor having an output terminal, and a current source circuit connected between the output terminal of said second transistor and a constant voltage, and the output terminal of said second transistor connected to the input terminal of said output transistor;
   wherein said source follower circuit determines a voltage level at said input terminal of said output transistor in a state where said first switch is closed and said voltage level causes said output current to flow, and in another state where said first switch is open and said output current does not flow; and the source terminal of said output transistor is connected to said constant voltage.

2. The high-speed current switch circuit according to claim 1, further comprising a second switch connected between said input terminal of said output transistor and said constant voltage; and
   wherein in a state where said second switch is closed, said input terminal of said output transistor is connected to said constant voltage.

3. The high-speed current switch circuit according to claim 1 or 2, further comprising a bias voltage generation circuit which generates a predetermined bias voltage to be supplied to an input terminal of said source follower circuit.

4. The high-speed current switch circuit according to claim 3, wherein a predetermined transistor included in said bias voltage generation circuit and said output transistor have a current mirror relationship.

5. The high-speed current switch circuit according to claim 3 wherein said bias voltage generation circuit includes stabilization means which stabilizes said generated predetermined bias voltage.

6. A high-speed current switch circuit, comprising:
   a current setting circuit in which a current is externally set;
   a selection circuit which selects a current path for said set current from a first current path and a second current path according to an input signal, and which includes first and second transistors;
   a current mirror circuit including a third transistor connected in series with said first transistor, a first source follower circuit which drives said third transistor, a fourth transistor which forms a current mirror relationship with said third transistor, and which supplies a desired output current, and a second source follower circuit which drives said fourth transistor under the same condition as said first source follower circuit, a feedback circuit formed between said third transistor and said first source follower circuit, said first and second source follower circuits being driven according to an output from said third transistor; and
   an output current optimization circuit which optimizes the rise of the output current of said current mirror circuit by adjusting a phase margin of said feedback circuit.

7. The high-speed current switch circuit according to claim 6, wherein said output current optimization circuit comprises:
   a variable resistance element connected between an output side of said first source follower circuit and an output side of said second source follower circuit, and capable of being changed between a low resistance and a high resistance;
   comparison means which compares a current corresponding to the output current from said fourth transistor with a predetermined value when the corresponding current rises, and which changes said variable resistance element from the low resistance to the high resistance when the corresponding current exceeds the predetermined value; and
   initialization means which changes said variable resistance element from the high resistance to the low resistance when the output current from said fourth transistor falls.

8. The high-speed current switch circuit according to claim 7, wherein said variable resistance element comprises a MOS transistor.

9. The high-speed current switch circuit according to claim 6, wherein said output current optimization circuit has a resistance element having a predetermined resistance value and being connected between the output side of said first source follower circuit and the output side of said second source follower circuit.

10. The high-speed current switch circuit according to claim 9, wherein said resistance element is made of polysilicon.

11. A high-frequency superimposition circuit having an oscillator and a high-speed current switch circuit which performs high-speed switching of an output current on the basis of an oscillation output from the oscillator, wherein:
    said high-speed current switch circuit comprises an output transistor which switches and outputs said output current, and a control circuit which comprises a source follower circuit and a switch, and said control circuit controls said output transistor;
    an output terminal of said source follower circuit is connected to an input terminal of said output transistor, and said switch is connected between said source follower circuit and a power supply;

said source follower circuit comprises a second transistor and a current source circuit which is connected between a source of said second transistor and a constant voltage;

wherein said source follower circuit determines a voltage level at said input terminal of said output transistor in a state where said switch is closed and said voltage level causes said output current to flow, and in another state where said switch is open and said output current does not flow; and a source terminal of said output transistor is connected to said constant voltage.

12. A high-frequency superimposition circuit according to claim 11, characterized in that said oscillator comprises:

oscillation means in which the oscillation frequency is controlled on the basis of a current or voltage externally supplied;

a constant current source circuit;

charge means which charges a capacitor with a constant current from said constant current source circuit on the basis of an oscillation output from said oscillation means; and control means which generates the current or voltage for control of the oscillation frequency of said oscillation means on the basis of electric charge stored in said capacitor and a predetermined reference value.

13. A high-frequency current source comprising a current drawing type of high-speed current switch circuit and a current supply type of high-speed current switch circuit, and which generates a high-frequency current according to a control signal externally supplied, said current drawing type of high-speed current switch circuit comprising: a first output transistor which switches and outputs a current and has an input terminal, an output terminal, and a source terminal; and a first control circuit for controlling said first output transistor, said first control circuit comprising a first source follower circuit and a first switch which is connected between said first source follower circuit and a power supply; and said current supply type of high-speed current switch circuit comprising: a second output transistor which switches and outputs a current and has an input terminal, an output terminal, and a source terminal; and a second control circuit for controlling said second output transistor, said second control circuit comprising a second source follower circuit and a second switch which is connected between said second source follower circuit and ground voltage;

said output terminal of said first output transistor connected to said output terminal of said second output transistor;

said first source follower circuit comprising a third transistor having an output terminal, and a first current source circuit connected between the output terminal of said third transistor and ground voltage, and the output terminal of said third transistor connected to the input terminal of said first output transistor;

said second source follower circuit comprising a fourth transistor having an output terminal, and a second current source circuit connected between the output terminal of said fourth transistor and the power supply, and the output terminal of said fourth transistor connected to the input terminal of said second output transistor;

wherein said first source follower circuit determines a voltage level at said input terminal of said first output transistor in a state where said first switch is closed and said voltage level causes said output current of said first transistor to flow, and in another state where said first switch is open and said output current of said first transistor does not flow; and the source terminal of said first output transistor is connected to ground; and said second source follower circuit determines a voltage level at said input terminal of said second output transistor in a state where said second switch is closed and said voltage level causes said output current of said second transistor to flow, and in another state where said second switch is open and said output current of said second transistor does not flow; and the source terminal of said second output transistor is connected to the power supply.

* * * * *

UNITED STATES PATENT AND TRADEMARK OFFICE
CERTIFICATE OF CORRECTION

PATENT NO. : 6,958,631 B2 Page 1 of 1
DATED : October 25, 2005
INVENTOR(S) : Yusuke Aiba et al.

It is certified that error appears in the above-identified patent and that said Letters Patent is hereby corrected as shown below:

Title page,
Item [75], Inventors, delete "Takeshi Fujita, Isehara (JP); Hideaki Hirose, Yokohama (JP);".
Item [74], *Attorney, Agent, or Firm*, "F arabow," should read -- Farabow, --.

Column 30,
Lines 27-28 and 29-30, "first transistor" should read -- first output transistor --.
Lines 36 and 38, "second transistor" should read -- second output transistor --.

Signed and Sealed this

Fourth Day of April, 2006

JON W. DUDAS
*Director of the United States Patent and Trademark Office*